United States Patent
Murata et al.

(10) Patent No.: US 12,063,801 B2
(45) Date of Patent: Aug. 13, 2024

(54) IMAGING ELEMENT AND IMAGING DEVICE INCLUDING AN ORGANIC SEMICONDUCTOR MATERIAL

(71) Applicant: SONY SEMICONDUCTOR SOLUTIONS CORPORATION, Kanagawa (JP)

(72) Inventors: Kenichi Murata, Kanagawa (JP); Masahiro Joei, Kanagawa (JP); Shingo Takahashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 811 days.

(21) Appl. No.: 17/260,861

(22) PCT Filed: Jul. 19, 2019

(86) PCT No.: PCT/JP2019/028474
§ 371 (c)(1),
(2) Date: Jan. 15, 2021

(87) PCT Pub. No.: WO2020/026851
PCT Pub. Date: Feb. 6, 2020

(65) Prior Publication Data
US 2021/0273017 A1  Sep. 2, 2021

(30) Foreign Application Priority Data

Jul. 31, 2018 (JP) ................................ 2018-143511
Dec. 14, 2018 (JP) ................................ 2018-234673

(51) Int. Cl.
*H10K 39/32* (2023.01)
*H01L 27/146* (2006.01)
*H10K 30/82* (2023.01)

(52) U.S. Cl.
CPC ....... *H10K 39/32* (2023.02); *H01L 27/14621* (2013.01); *H01L 27/14643* (2013.01); *H10K 30/82* (2023.02)

(58) Field of Classification Search
CPC .. H10K 39/32; H10K 30/82; H01L 27/14621; H01L 27/14643
(Continued)

(56) References Cited

U.S. PATENT DOCUMENTS

2009/0237543 A1  9/2009 Hatano
2013/0016035 A1  1/2013 Ikeda
(Continued)

FOREIGN PATENT DOCUMENTS

CN  101207144 A  6/2008
CN  102290424 A  12/2011
(Continued)

OTHER PUBLICATIONS

International Search Report prepared by the Japan Patent Office on Sep. 20, 2019, for International Application No. PCT/JP2019/028474.

*Primary Examiner* — Xia L Cross
(74) *Attorney, Agent, or Firm* — Sheridan Ross PC

(57) ABSTRACT

An imaging element according to an embodiment of the present disclosure includes: a semiconductor substrate having an effective pixel region in which a plurality of pixels is disposed and a peripheral region provided around the effective pixel region; an organic photoelectric converter including a first electrode, a second electrode, a charge accumulation layer, and an organic photoelectric conversion layer, the first electrode being provided on a light receiving surface of the semiconductor substrate and including a plurality of electrodes, the second electrode being opposed to the first electrode, the charge accumulation layer and the organic
(Continued)

photoelectric conversion layer being stacked in this order between the first electrode and the second electrode and extending over the effective pixel region; and a first hydrogen-blocking layer that covers above the organic photoelectric conversion layer, a side surface of the organic photoelectric conversion layer, and a side surface of the charge accumulation layer.

20 Claims, 28 Drawing Sheets

(58) Field of Classification Search
   USPC .......................................................... 257/431
   See application file for complete search history.

(56) References Cited

U.S. PATENT DOCUMENTS

2013/0020566 A1* 1/2013 Suzuki ................. H10K 30/353
                                                    257/E51.026
2015/0115243 A1    4/2015 Miyanami
2019/0259815 A1*   8/2019 Kataoka ............ H01L 27/14623

FOREIGN PATENT DOCUMENTS

| CN | 102812159 A | 12/2012 | | |
|----|-------------|---------|---|---|
| CN | 103972254 A | 8/2014 | | |
| CN | 105409002 A | 3/2016 | | |
| JP | 2008-300396 | 12/2008 | | |
| JP | WO2011074440 A1 | 4/2013 | | |
| JP | 2013098322 A | 5/2013 | | |
| JP | 2016-122732 | 7/2016 | | |
| JP | 2018-060910 | 4/2018 | | |
| JP | 2018060910 | * 4/2018 | ............ | H01L 27/14 |
| WO | WO-2016002611 A1 | 1/2016 | | |
| WO | WO-2016056397 A1 | 4/2016 | | |
| WO | WO-2018066256 A1 | 4/2018 | | |
| WO | WO-2018096980 A2 | 5/2018 | | |

* cited by examiner

IMAGING ELEMENT AND IMAGING DEVICE INCLUDING AN ORGANIC SEMICONDUCTOR MATERIAL

CROSS REFERENCE TO RELATED APPLICATIONS

This application is a national stage application under 35 U.S.C. 371 and claims the benefit of PCT Application No. PCT/JP2019/028474 having an international filing date of 19 Jul. 2019, which designated the United States, which PCT application claimed the benefit of Japanese Patent Application Nos. 2018-143511, filed 31 Jul. 2018 and 2018-234673, filed 14 Dec. 2018, the entire disclosures of each of which are incorporated herein by reference.

TECHNICAL FIELD

The present disclosure relates to an imaging element and an imaging device each including a photoelectric conversion layer containing an organic semiconductor material.

BACKGROUND ART

For an imaging device such as a CCD (Charge Coupled Device) image sensor or a CMOS (Complementary Metal Oxide Semiconductor) image sensor, a stacked imaging element has recently been used in which an organic photoelectric conversion layer containing an organic semiconductor material is stacked on a semiconductor substrate having a photodiode embedded therein. In the stacked imaging element, it is possible to extract R/G/B signals from one pixel and no demosaic process is necessitated; therefore, there is an advantage that false color does not occur.

However, the stacked imaging element has the following issues. For example, an inorganic photoelectric converter including a photodiode temporarily accumulates charges generated by photoelectric conversion in the inorganic photoelectric converter and then transfers the charges to a floating diffusion layer (floating diffusion; FD), which makes it possible to completely deplete the inorganic photoelectric converter. In another case, an organic photoelectric converter including an organic photoelectric conversion layer accumulates charges generated by photoelectric conversion in a direct floating diffusion layer FD, which makes it difficult to completely deplete the organic photoelectric converter, thereby increasing kTC noise, increasing random noise, and causing deterioration of a captured image quality.

In contrast, for example, PTL 1 discloses an imaging element including a charge accumulation electrode in a photoelectric converter. The photoelectric converter is provided above a semiconductor substrate and formed by stacking a first electrode, a photoelectric conversion layer, and a second electrode. The charge accumulation electrode is included in the photoelectric converter and is disposed spaced apart from the first electrode and disposed oppositely to the photoelectric conversion layer via an insulating layer. This imaging element is able to accumulate the charges generated by the photoelectric conversion on the charge accumulation electrode, and is therefore able to completely deplete a charge accumulation section at the start of exposure and to erase the charges. As a result, occurrence of a phenomenon such as the increase in the kTC noise and the increase in the random noise is suppressed, and the deterioration of the captured image quality is reduced. Further, PTL 1 discloses an example in which the photoelectric conversion layer has a stacked structure of a lower semiconductor layer and an upper photoelectric conversion layer, as a structure for preventing recombination of charges accumulated in the photoelectric conversion layer and increasing a transfer efficiency to the first electrode.

CITATION LIST

Patent Literature

PTL 1: Japanese Unexamined Patent Application Publication No. 2017-157816

SUMMARY OF THE INVENTION

Incidentally, although the lower semiconductor layer is formed using, for example, an oxide semiconductor material such as IGZO, the oxide semiconductor material is easily reduced by hydrogen, and oxygen defects are generated. For this reason, the imaging element provided with the lower semiconductor layer may have a decreased operation stability, and an improvement in reliability is demanded.

It is desirable to provide an imaging element and an imaging device that are able to improve reliability.

An imaging element according to an embodiment of the present disclosure includes: a semiconductor substrate having an effective pixel region in which a plurality of pixels is disposed and a peripheral region provided around the effective pixel region; an organic photoelectric converter including a first electrode, a second electrode, a charge accumulation layer, and an organic photoelectric conversion layer, the first electrode being provided on a light receiving surface of the semiconductor substrate and including a plurality of electrodes, the second electrode being opposed to the first electrode, the charge accumulation layer and the organic photoelectric conversion layer being stacked in this order between the first electrode and the second electrode and extending over the effective pixel region; and a first hydrogen-blocking layer that covers above the organic photoelectric conversion layer, a side surface of the organic photoelectric conversion layer, and a side surface of the charge accumulation layer.

An imaging device according to an embodiment of the present disclosure includes the imaging element according to the embodiment of the present disclosure described above.

The imaging element according to the embodiment of the present disclosure and the imaging device according to the embodiment of the present disclosure are each provided with the organic photoelectric converter including the charge accumulation layer and the organic photoelectric conversion layer which are stacked in this order between the first electrode and the second electrode and extending over the effective pixel region. In the organic photoelectric converter, the first hydrogen-blocking layer is provided that covers above the organic photoelectric conversion layer, the side surface of the organic photoelectric conversion layer, and the side surface of the charge accumulation layer. This suppresses entry of hydrogen into the charge accumulation layer.

MODES FOR CARRYING OUT THE INVENTION

The following describes an embodiment of the present disclosure in detail with reference to the drawings. The following description is a specific example of the present disclosure, but the present disclosure is not limited to the following mode. In addition, the present disclosure does not limit the disposition, dimensions, dimension ratios, and the like of respective components illustrated in the respective diagrams thereto. It is to be noted that description is given in the following order.

1. First Embodiment (an example in which a first hydrogen-blocking layer is provided that covers above and side surfaces of a photoelectric conversion layer and a charge accumulation layer)
1-1. Configuration of Imaging Element
1-2. Method of Manufacturing Imaging Element
1-3. Workings and Effects
2. Second Embodiment
(an example in which a second hydrogen-blocking layer is further provided in a lower layer of a lower electrode)
3. Third Embodiment
(an example in which the first hydrogen-blocking layer and the second hydrogen-blocking layer are directly stacked in a peripheral region)

4. Fourth Embodiment
(an example in which an insulating layer on the lower electrode is formed as the second hydrogen-blocking layer)
5. Modification Example
(another example of pixel layout)
6. Application Example
7. Practical Application Example

1. First Embodiment

Figure 1:
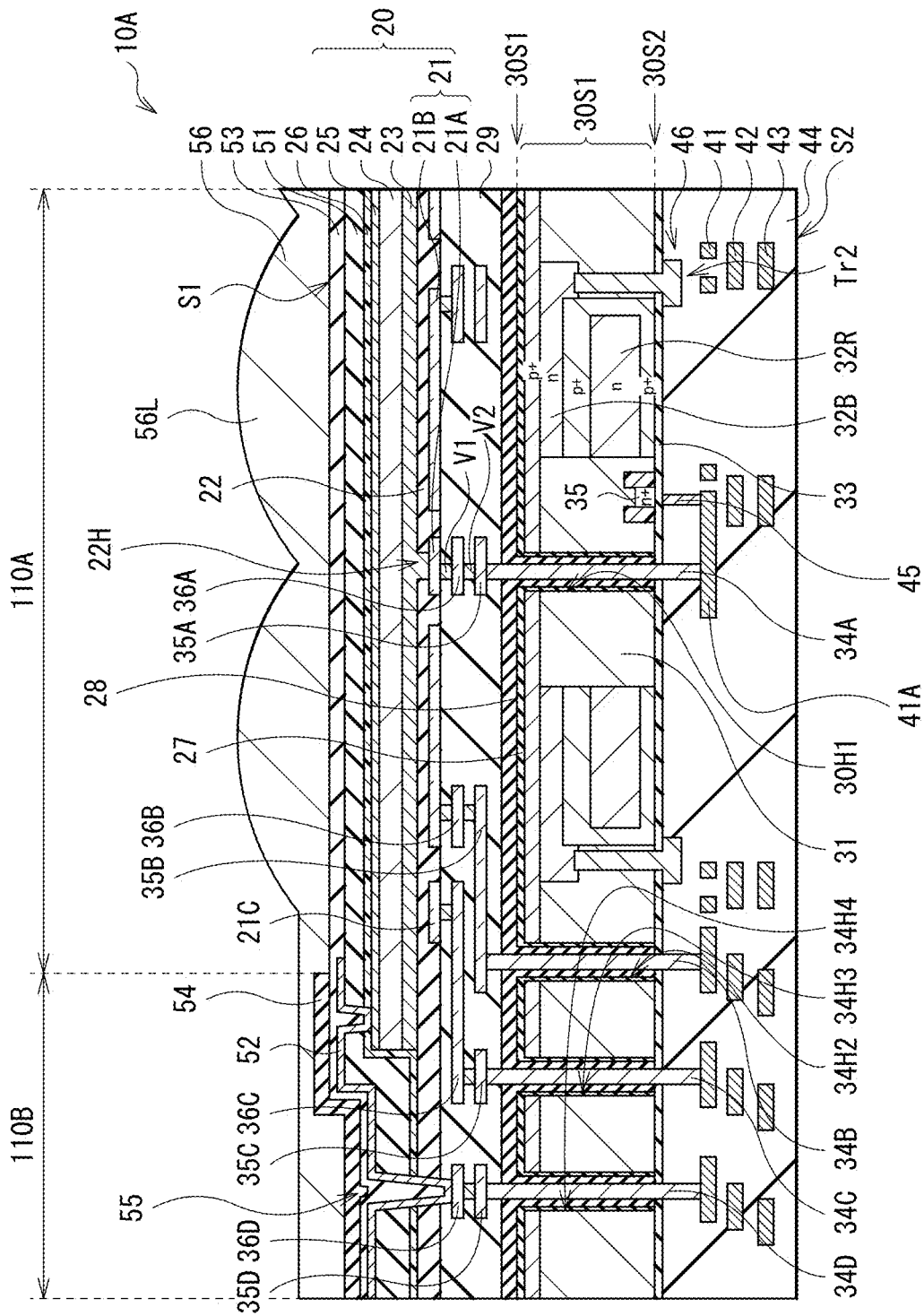
FIG. 1 is a cross-sectional schematic view illustrating a schematic configuration of an imaging element according to a first embodiment of the present disclosure.
Figure 2:
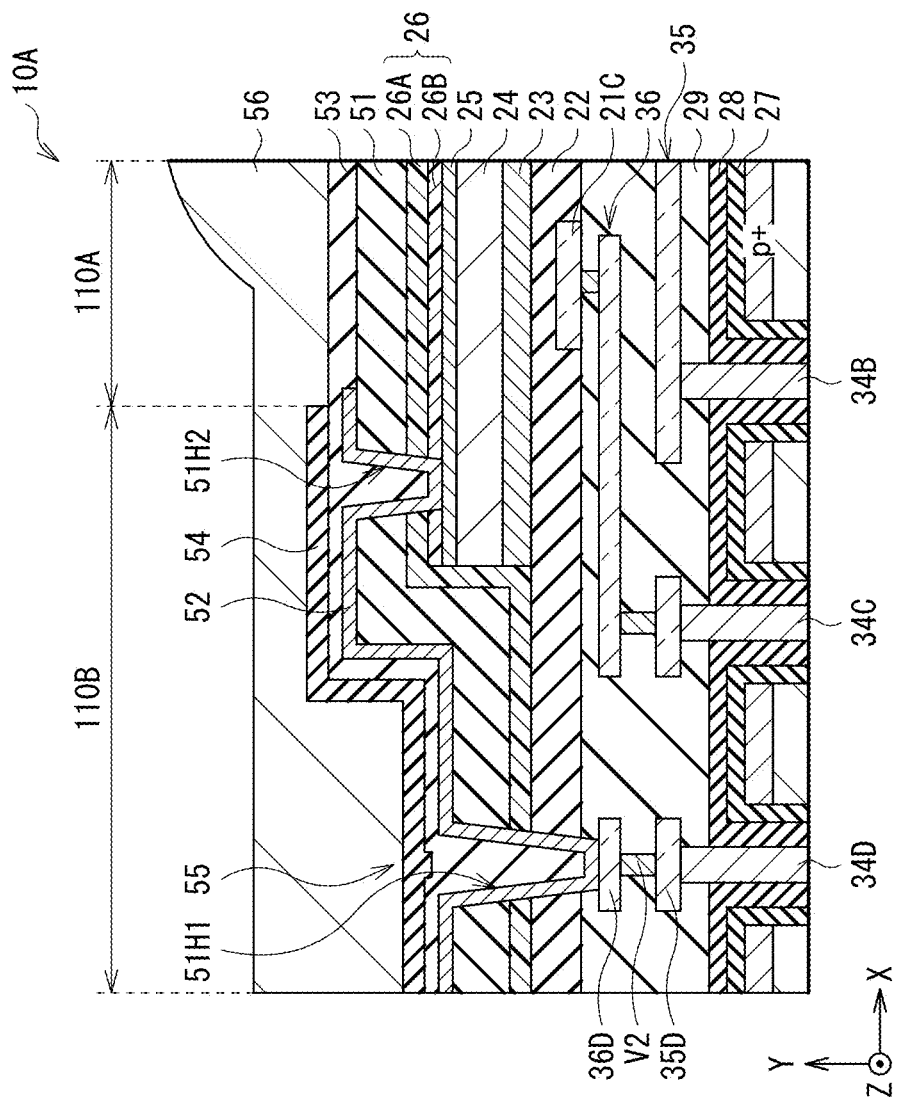
FIG. 2 is a cross-sectional schematic view illustrating a configuration of a main part of the imaging element illustrated in FIG. 1.
Figure 3:
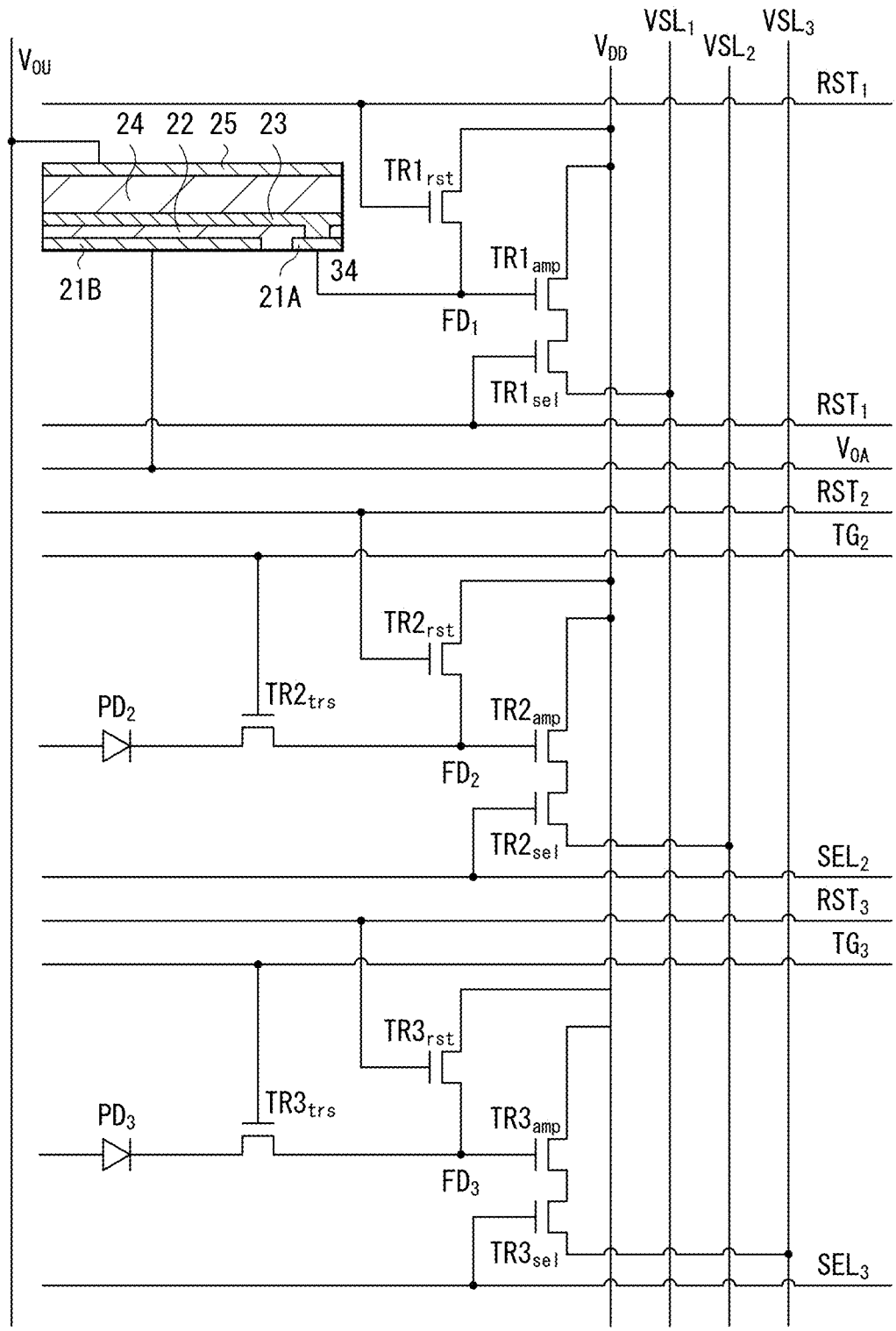
FIG. 3 is an equivalent circuit diagram of the imaging element illustrated in FIG. 1.
Figure 4:
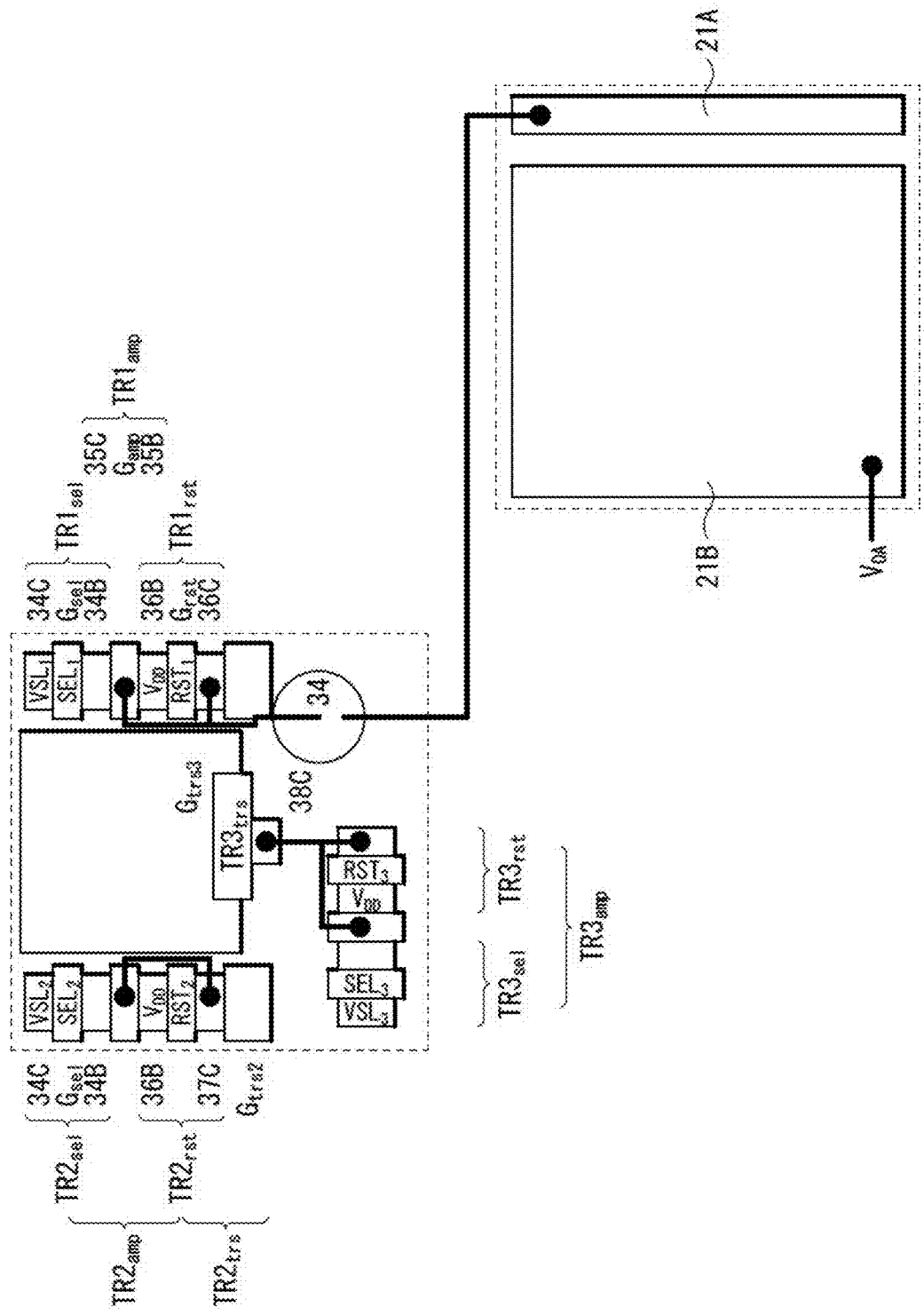
FIG. 4 is a schematic diagram illustrating disposition of a lower electrode and a transistor included in a control section of the imaging element illustrated in FIG. 1.

FIG. 1 illustrates a cross-sectional configuration of an imaging element (imaging element 10A) according to a first embodiment of the present disclosure. FIG. 2 illustrates a cross-sectional configuration of a main part of the imaging element 10A illustrated in FIG. 1. FIG. 3 is an equivalent circuit diagram of the imaging element 10A illustrated in FIG. 1. FIG. 4 schematically illustrates disposition of a lower electrode 21 and a transistor included in a control section of the imaging element 10 illustrated in FIG. 1. The imaging element 10A is included, for example, in one pixel (unit pixel P) in an imaging device such as a CMOS (Complementary Metal Oxide Semiconductor) image sensor (imaging device 1; see FIG. 28) included in an electronic apparatus such as a digital still camera or a video camera. The imaging device 1 includes an effective pixel region 110A in which a plurality of pixels is disposed, and a peripheral region 110B provided around the effective pixel region in which a peripheral circuit such as a row scanner 131, for example, is formed. The plurality of pixels each includes the imaging element 10A.

The imaging element 10A according to the present embodiment is provided with an organic photoelectric converter 20 on a light receiving surface (first surface; surface 30S1) of a semiconductor substrate 30. The organic photoelectric converter 20 has a configuration in which a lower electrode 21 (first electrode) including a plurality of electrodes, an insulating layer 22, a charge accumulation layer 23, a photoelectric conversion layer 24 (organic photoelectric conversion layer), and an upper electrode 25 (second electrode) are stacked in this order from a semiconductor substrate 30 side. In the present embodiment, the stacked charge accumulation layer 23 and photoelectric conversion layer 24 are formed to extend over the effective pixel region 110A as a common layer with respect to the plurality of pixels provided on the effective pixel region 110A. The present embodiment further has a configuration in which a hydrogen-blocking layer 26 (first hydrogen-blocking layer) that covers above the photoelectric conversion layer 24, a side surface of the photoelectric conversion layer 24, and a side surface of the charge accumulation layer 23 is formed. Further, the imaging element 10A according to the present embodiment has a pixel sharing structure in which four pixels that are adjacent to each other share one floating diffusion FD1, one floating diffusion FD2, and one floating diffusion FD3 each corresponding to each of the four pixels.

1-1. Configuration of Imaging Element

The imaging element 10A is, for example, a so-called vertical spectroscopic imaging element in which one organic photoelectric converter 20 and two inorganic photoelectric converters 32B and 32R are stacked in the vertical direction. The organic photoelectric converter 20 is provided on the first surface (back surface; surface 30S1) side of the semiconductor substrate 30. The inorganic photoelectric converters 32B and 32R are formed to be embedded in the semiconductor substrate 30 and stacked in the thickness direction of the semiconductor substrate 30.

As will be described in detail later, the organic photoelectric converter 20 includes the charge accumulation layer 23 and the photoelectric conversion layer 24 between the lower electrode 21 and the upper electrode 25. The lower electrode 21 and the upper electrode 25 are opposed to each other. The organic photoelectric converter 20 is provided with an insulating layer 22 between the lower electrode 21 and the charge accumulation layer 23. The organic photoelectric converter 20 includes the lower electrode 21 having a plurality of electrodes (a readout electrode 21A, an accumulation electrode 21B, and a shield electrode 21C). The readout electrode 21A is electrically coupled to the charge accumulation layer 23 via an opening 22H formed in the insulating layer 22. The photoelectric conversion layer 24 includes a p-type semiconductor and an n-type semiconductor and has a bulk heterojunction structure in the layer. The bulk heterojunction structure is a p/n junction surface formed by mixing the p-type semiconductor and the n-type semiconductor.

The organic photoelectric converter 20 and the inorganic photoelectric converters 32B and 32R perform photoelectric conversion by selectively detecting the respective pieces of light in different wavelength ranges. Specifically, for example, the organic photoelectric converter 20 acquires a color signal of green (G). The inorganic photoelectric converters 32B and 32R respectively acquire a color signal of blue (B) and a color signal of red (R) by using different absorption coefficients. This enables the imaging element 10A to acquire a plurality of types of color signals in one pixel without using color filters.

It is to be noted that, in the present embodiment, description is given of a case of reading the electron of a pair (electron-hole pair) of the electron and hole generated from photoelectric conversion as a signal charge (case where the n-type semiconductor region is used as a photoelectric conversion layer). In addition, in the diagram, "+(plus)" attached to "p" and "n" indicates high p-type or n-type impurity concentration.

The second surface (front surface; 30S2) of the semiconductor substrate 30 is provided, for example, with floating diffusions (floating diffusion layers) FD1 (region 35 in the semiconductor substrate 30), FD2, and FD3, transfer transistors TR2trs and TR3trs, amplifier transistors (modulation elements) TR1amp and TR2amp, reset transistors TR1rst and TR2rst, selection transistors TR1sel and TR2sel, and a multilayer wiring line 40. The multilayer wiring line 40 has a configuration in which wiring layers 41, 42, and 43 are, for example, stacked in an insulating layer 44.

It is to be noted that the first surface (surface 30S1) side of the semiconductor substrate 30 is referred to as light incidence side S1 and the second surface (surface 30S2) side is referred to as wiring layer side S2 in the diagrams.

Figure 5A:
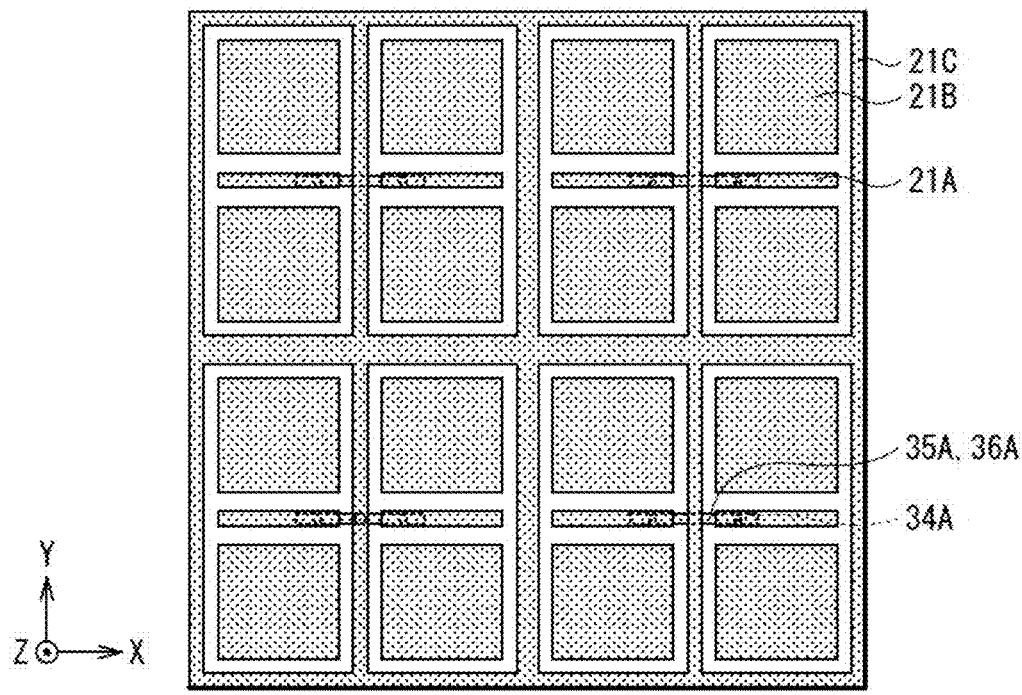
FIG. 5A is a plan schematic view of an example of a layout of a lower electrode included in an organic photoelectric converter illustrated in FIG. 1.
Figure 6A:
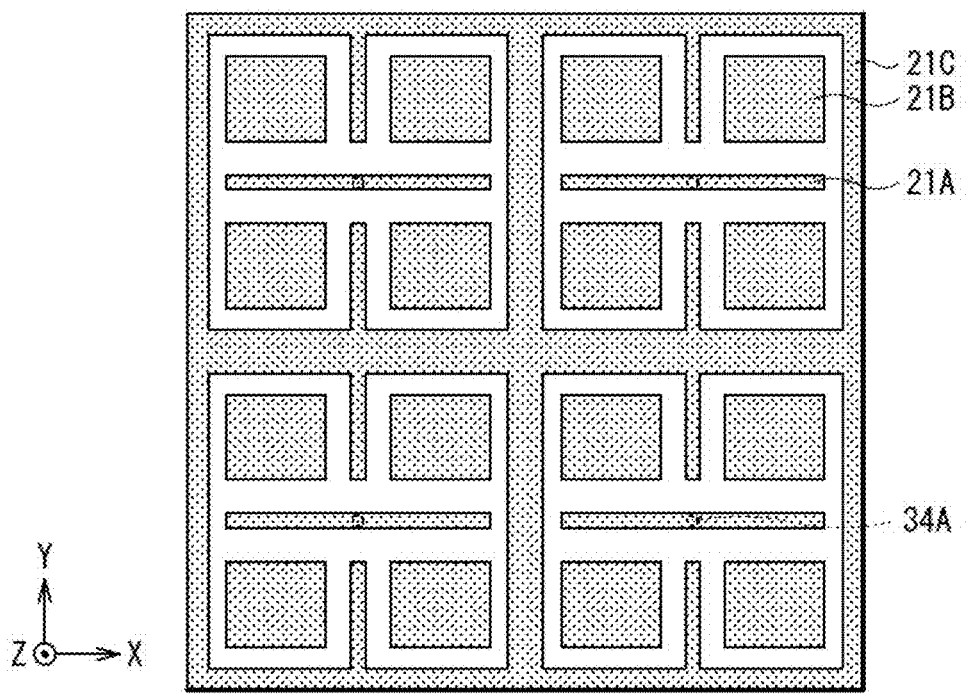
FIG. 6A is a plan schematic view of another example of the layout of the lower electrode included in the organic photoelectric converter illustrated in FIG. 1.

The organic photoelectric converter 20 has a configuration in which, for example, the lower electrode 21, the insulating layer 22, the charge accumulation layer 23, the photoelectric conversion layer 24, and the upper electrode 25 are stacked in this order from the first surface (surface 30S1) side of the semiconductor substrate 30. For example, the lower electrodes 21 are formed separately for the respective imaging elements 10A. The lower electrodes 21 each include the readout electrode 21A and the accumulation electrode 21B that are separated from each other with the insulating layer 22 interposed therebetween, and the shield electrode 21C that surrounds the four pixels that are adjacent to each other. Of the lower electrode 21, the readout electrode 21A is shared between two or four pixels that are adjacent to each other, and is electrically coupled to the charge accumulation layer 23 via the opening 22H provided in the insulating layer 22, as illustrated in FIGS. 5A and 6A, for example. In FIG. 1, the charge accumulation layer 23, the photoelectric conversion layer 24, and the upper electrode 25 are provided as continuous layers common to the plurality of imaging elements 10A, and extend over the effective pixel region 110A. On the upper electrode 25, the hydrogen-blocking layer 26 is further provided. For example, in the peripheral region 110B, the hydrogen-blocking layer 26 is stacked over the insulating layer 22, from over the upper electrode 25 via the side surfaces of the upper electrode 25, the photoelectric conversion layer 24, and the charge accumulation layer 23.

Between the first surface (surface 30S1) of semiconductor substrate 30 and the lower electrode 21, a fixed-charge layers 27, an insulating layer 28, and an interlayer insulating layer 29 are provided, for example, in this order. Over the hydrogen-blocking layer 26, a first protective layer 51, a second protective layer 53, and an on-chip lens layer 56 are provided in this order. Further, in the peripheral region 110B, a wiring line 52 is provided between the first protective layer 51 and the second protective layer 53, and a light-shielding film 54 is provided between the second protective layer 53 and the on-chip lens layer 56.

Through electrodes 34A, 34B, 34C, and 34D are provided between the first surface (surface 30S1) and the second surface (surface 30S2) of the semiconductor substrate 30. The through electrode 34A is electrically coupled to the readout electrode 21A of the organic photoelectric converter 20. The organic photoelectric converter 20 is coupled to a gate Gamp of the amplifier transistor TR1amp and the one source/drain region of the reset transistor RST (reset transistor TR1rst) also serving as the floating diffusion FD1 via the through electrode 34, for example. This allows the imaging element 10A to favorably transfer charges (electrons here) generated in the organic photoelectric converter 20 on the first surface (surface 30S21) side of the semiconductor substrate 30 to the second surface (surface 30S2) side of the semiconductor substrate 30, thereby increasing characteristics. The through electrode 34B is electrically coupled to the accumulation electrode 21B of the organic photoelectric converter 20, allowing a voltage to be applied to the accumulation electrode 21B independently of the readout electrode 21A. Through electrode 34C is electrically coupled to the shield electrode 21C, which suppresses leakage of charges to adjacent pixels. The through electrode 34D is electrically coupled to a pad section 36D provided in the peripheral region 110B. As illustrated in FIG. 2, the wiring line 52 is electrically coupled to the pad section 36D via an opening 51H1, which is to be a guard ring 55. This allows a voltage to be applied to the upper electrode 25. Further, the guard ring 55 is able to prevent water from entering from an outer periphery. It is to be noted that the wiring line 52 included in the guard ring 55 is not necessarily electrically coupled to the upper electrode 25. In addition, although an example in which the second protective layer 53 is embedded in the opening 51H1 included in the guard ring 55 has been indicated in FIG. 2, the present disclosure is not limited thereto, and, for example, the hydrogen-blocking layer 26 or the first protective layer 51 may be embedded.

Lower ends of the through electrode 34A, 34B, 34C, and 34D are each coupled to the wiring layer 41. In particular, the through electrode 34A is coupled to a coupling section 41A in the wiring layer 41, and the coupling section 41A and the floating diffusion FD1 (region 35) are coupled via a lower first contact 45, for example. An upper end of the through electrode 34A is coupled to the readout electrode 21A, for example, via a pad section 35A, a via V2, a pad section 36A, and a via V1.

The through electrode 34A is provided for each of the four pixels that are adjacent to each other. The through electrode 34A has a function of a connector for the organic photoelectric converter 20 of each pixel and the gate Gamp of the amplifier transistor TR1amp and the floating diffusion FD1. The through electrode 34A serves as a transmission path for charges (electrons here) generated in the organic photoelectric converter 20.

A reset gate Grst of the reset transistor TR1rst is disposed next to the floating diffusion FD1 (one source/drain region of the reset transistor TR1rst). This allows the reset transistor TR1rst to reset the charges accumulated in the floating diffusion FD1.

In the imaging element 10A according to the present embodiment, light entering the organic photoelectric converter 20 from the upper electrode 25 side is absorbed by the photoelectric conversion layer 24. The excitons generated by this each move to the interface between an electron donor and an electron acceptor included in the photoelectric conversion layer 24 and undergoes exciton dissociation. In other words, the exciton is separated into an electron and a hole. The charges (electrons and holes) generated here are transported to different electrodes by diffusion due to a difference in concentration in the carriers and an internal electric field caused by the different work functions of the anode (upper electrode 25 here) and the cathode (lower electrode 21 here). The transported charges are detected as a photocurrent. In addition, the application of a potential between the lower electrode 21 and the upper electrode 25 makes it possible to control the transport direction of electrons and holes.

The following describes configurations, materials, and the like of the respective sections.

The organic photoelectric converter 20 is an organic photoelectric conversion element that absorbs green light corresponding to a portion or all of a selective wavelength range (e.g., 450 nm or more and 650 nm or less) and generates electron-hole pairs.

As described above, the lower electrode 21 includes the readout electrode 21A, the accumulation electrode 21B, and the shield electrode 21C that are formed separately. The readout electrode 21A transfers charges (electrons here) generated in the photoelectric conversion layer 24 to the floating diffusion FD1. For example, the readout electrode 21A is coupled to the floating diffusion FD1 via the via V1, the pad section 36A, the via V2, the pad section 35A, the through electrode 34, the coupling section 41A, and the lower first contact 45. The accumulation electrode 21B is for accumulating the electrons of the charges generated in the photoelectric conversion layer 24 in the charge accumulation layer 23 as signal charges. The accumulation electrode 21B is provided in a region that is opposed to the light receiving surfaces of the inorganic photoelectric converters 32B and 32R formed in the semiconductor substrate 30 and covers these light receiving surfaces. It is desirable that the accumulation electrode 21B be larger than the readout electrode 21A. The shield electrode 21C is for suppressing leakage of charges to adjacent pixels as described above.

The lower electrode 21 includes an electrically conducive film having light transmissivity. The lower electrode 21 includes, for example, ITO (indium-tin oxide). However, in addition to ITO, a tin oxide ($SnO_2$)-based material to which a dopant is added or a zinc oxide-based material prepared by adding a dopant to a zinc oxide (ZnO) may be used as a material included in the lower electrode 21. Examples of the zinc oxide-based materials include aluminum zinc oxide (AZO) to which aluminum (Al) is added as a dopant, gallium (Ga)-added gallium zinc oxide (GZO), and indium (In)-added indium zinc oxide (IZO). In addition to these, CuI, InSbO$_4$, ZnMgO, CuInO$_2$, MgIN$_2$O$_4$, CdO, ZnSnO$_3$, and the like may also be used. The lower electrode 21 has a thickness of preferably 20 nm to 200 nm, for example, and more preferably 30 nm or more and 100 nm or less.

The insulating layer 22 is for electrically insulating the accumulation electrode 21B and the charge accumulation layer 23. The insulating layer 22 is provided, for example, on the interlayer insulating layer 29 and the lower electrode 21 to cover the lower electrode 21. In addition, the insulating layer 22 is provided with an opening 22H on the readout electrode 21A of the lower electrode 21. The readout electrode 21A and the charge accumulation layer 23 are electrically coupled via this opening 22H. The insulating layer 22 includes, for example, a single-layer film including one of silicon oxide (SiO$_x$), silicon nitride (SiN$_x$), silicon oxynitride (SiO$_x$N$_y$), and the like or a stacked film including two or more of them. The insulating layer 22 has a thickness of 20 nm to 500 nm, for example.

The charge accumulation layer 23 is provided in a lower layer of the photoelectric conversion layer 24, specifically, between the insulating layer 22 and the photoelectric conversion layer 24. The charge accumulation layer 23 is for accumulating signal charges (electrons here) generated in the photoelectric conversion layer 24. It is preferable that the charge accumulation layer 23 be formed by using a material having higher charge mobility and having a larger band gap than that of the photoelectric conversion layer 24. For example, it is preferable that the band gap of a material included in the charge accumulation layer 23 be 3.0 eV or more. Examples of such a material include an oxide semiconductor material such as IGZO, an organic semiconductor material, and the like. Examples of the organic semiconductor material include transition metal dichalcogenide, silicon carbide, diamond, graphene, a carbon nanotube, a fused polycyclic hydrocarbon compound, a fused heterocyclic compound, and the like. The charge accumulation layer 23 has a thickness of 10 nm or more and 300 nm or less, for example. The charge accumulation layer 23 including the above-described materials is disposed in a lower layer of the photoelectric conversion layer 24. This makes it possible to prevent the charges from being recombined during the charge accumulation period and increase the transfer efficiency.

The photoelectric conversion layer 24 converts light energy to electric energy. The photoelectric conversion layer 24 includes, for example, two or more types of organic semiconductor materials (p-type semiconductor material or n-type semiconductor material) that each function as a p-type semiconductor or an n-type semiconductor. The photoelectric conversion layer 24 includes, in the layer, the junction surface (p/n junction surface) between these p-type semiconductor material and n-type semiconductor material. The p-type semiconductor relatively functions as an electron donor (donor) and the n-type semiconductor relatively functions an electron acceptor (acceptor). The photoelectric conversion layer 24 provides a field in which excitons generated when absorbing light are separated into electrons and holes. Specifically, excitons are separated into electrons and holes at the interface (p/n junction surface) between the electron donor and the electron acceptor.

The photoelectric conversion layer 24 may include an organic material or a so-called dye material in addition to the p-type semiconductor material and the n-type semiconductor material. The organic material or dye material photoelectrically converts light in a predetermined wavelength range and transmits light in another wavelength range. In a case where the photoelectric conversion layer 24 is formed by using the three types of organic materials of a p-type semiconductor material, an n-type semiconductor material, and a dye material, it is preferable that the p-type semiconductor material and the n-type semiconductor material be materials each having light transmissivity in a visible region (e.g., 450 nm to 800 nm). The photoelectric conversion layer 24 has a thickness of 50 nm to 500 nm, for example.

Examples of the organic materials included in the photoelectric conversion layer 24 include quinacridone, boron chloride subphthalocyanine, pentacene, benzothienobenzothiophene, fullerene, and derivatives thereof. The photoelectric conversion layer 24 includes a combination of the above-described two or more types of organic materials. The above-described organic materials function as a p-type semiconductor or an n-type semiconductor depending on the combination.

It is to be noted that the organic materials included in the photoelectric conversion layer 24 are not particularly limited. For example, any one of naphthalene, anthracene, phenantherene, tetracene, pyrene, perylene, and fluoranthene or derivatives thereof is favorably used in addition to the organic materials listed above. Alternatively, a polymer such as phenylenevinylene, fluorene, carbazole, indole, pyrene, pyrrole, picoline, thiophene, acetylene, and diacetylene or a derivative thereof may be used. Additionally, it is possible to favorably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and croconic methine group as a bonded chain, or by a squarylium group or a croconic methine group, etc. It is to be noted that the above-described metal complex dye is preferably, but not limited to, a dithiol metal complex-based dye, a metallophthalocyanine dye, a metalloporphyrine dye, or a ruthenium complex dye.

There may be provided other layers between the photoelectric conversion layer 24 and the lower electrode 21 (e.g., between the charge accumulation layer 23 and the photoelectric conversion layer 24) and between the photoelectric conversion layer 24 and the upper electrode 25. Specifically, for example, the charge accumulation layer 23, an electron blocking film, the photoelectric conversion layer 24, a hole blocking film, a work function adjustment film, and the like may be stacked in order from the lower electrode 21 side. Further, there may be provided an underlying layer and a hole transfer layer between the lower electrode 21 and the photoelectric conversion layer 24 and there may be provided a buffer layer and an electron transfer layer between the photoelectric conversion layer 24 and the upper electrode 25.

The upper electrode 25 includes an electrically conductive film having light transmissivity as with the lower electrode 21. In the imaging device 1 including the imaging element 10A as one pixel, the upper electrodes 25 may be separated for the respective pixels or formed as an electrode common to the respective pixels. The upper electrode 25 has a thickness of 10 nm to 200 nm, for example. As illustrated in FIG. 2, the wiring line 52 is electrically coupled to the upper electrode 25 via an opening 51H2, for example. The wiring line 52 is electrically coupled to the pad section 36D through opening 51H1 as illustrated in FIG. 2. That is, the upper electrode 25 is electrically coupled to the pad section 36D via the wiring line 52, for example.

The hydrogen-blocking layer 26 is for inhibiting the entry of hydrogen ($H_2$) into the charge accumulation layer 23. As described above, the hydrogen-blocking layer 26 is provided on the upper electrode 25 in the effective pixel region 110A. In the peripheral region 110B, the hydrogen-blocking layer 26 is stacked on the upper surface of the upper electrode 25, the side surfaces of the upper electrode 25, the photoelectric conversion layer 24, and the charge accumulation layer 23, and the insulating layer 22, and is formed so as to extend, for example, to the end of the peripheral region 110B. Example of the material contained in the hydrogen-blocking layer 26 includes an insulating material. Specifically, it is preferable to use a material having light transmissivity and a high sealing property, and examples of such a material include a metal oxide such as aluminum oxide ($AlO_x$), silicon nitride ($SiN_x$), carbon-containing silicon oxide (SiOC), and the like. Alternatively, an oxide semiconductor such as ITO (indium tin oxide) may be used for the hydrogen-blocking layer 26. In addition, it is preferable that the hydrogen-blocking layer 26 have a lower hydrogen content than, for example, the insulating layer 22, or that the film itself do not contain hydrogen. Further, it is preferable that the hydrogen-blocking layer 26 have a small stress and further have an ultraviolet absorbing ability. Still further, it is preferable to form a film having a small amount of moisture contained therein and to suppress entry of moisture ($H_2O$). Thus, it is preferable to use aluminum oxide ($AlO_x$) among the above materials as a material for the hydrogen-blocking layer 26. The hydrogen-blocking layer 26 includes a single-layer film including the above material or a stacked film including two or more of the above materials. The hydrogen-blocking layer 26 has a thickness of, for example, 10 nm or more and 1000 nm or less.

The fixed charge layer 27 may be a film having a positive fixed charge or a film having a negative fixed charge. Examples of a material of the film having the negative fixed charge include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxynitride ($HfO_xN_y$), aluminum oxynitride ($AlO_xN_y$), and the like.

The fixed charge layer 27 may have a structure in which two or more kinds of films are stacked. This makes it possible to further improve a function as a hole accumulation layer in a case of the film having the negative fixed charge, for example.

The insulating layer 28 is provided on the fixed charge layer 27 formed on the first surface (surface 30S1) of the semiconductor substrate 30, and, in the through holes 30H1, 30H2, 30H3, and 30H4 where the through electrodes 34A, 34B, 34C, and 34D are formed, provided between the fixed charge layer 27 and the through electrodes 34A, 34B, 34C, and 34D. The insulating layer 28 is for electrically insulating the through electrode 34 and the semiconductor substrate 30. A material of the insulating layer 28 is not particularly limited, and the insulating layer 28 is formed by using, for example, silicon oxide ($SiO_x$), TEOS, silicon nitride ($SiN_x$), silicon oxynitride ($SiO_xN_y$), and the like.

The interlayer insulating layer 29 includes, for example, similarly to the insulating layer 28, a single-layer film including one of silicon oxide ($SiO_x$), TEOS, silicon nitride ($SiN_x$), silicon oxynitride ($SiO_xN_y$), and the like or a stacked film including two or more of them. It is to be noted that the interlayer insulating layer 29 includes wiring lines such as the pad sections 35A and 36A that electrically couple the readout electrode 21A to the through electrode 34A, pad sections 35B and 36B that electrically couple the accumulation electrode 21B to the through electrode 34B, pad sections 35C and 36C that electrically couple the shield electrode 21C to the through electrode 34C, pad sections 35D and 36D that electrically couple the wiring line 52 to the through electrode 34D, and the vias V1 and V2 that electrically couple each electrode to the pad section, for example.

The first protective layer 51 and the second protective layer 53 are provided on the entire surface of the semiconductor substrate 30, including, for example, the effective pixel region 110A and the peripheral region 110B. It is preferable that the first protective layer 51 and the second protective layer 53 be formed using, for example, a material having a light transmissivity and having a high sealing property. Such a material includes, for example, an insulating material such as aluminum oxide ($AlO_x$), silicon nitride ($SiN_x$), and carbon-containing silicon oxide (SiOC). In addition, as in the case of the hydrogen-blocking layer 26, it is preferable that the first protective layer 51 and the second protective layer 53 have a lower hydrogen content than, for example, the insulating layer 22, or that the film itself does not contain hydrogen. Further, it is preferable that the first protective layer 51 and the second protective layer 53 have a small stress and further have an ultraviolet absorbing ability. Still further, it is preferable that the first protective layer 51 and the second protective layer 53 have a small amount of water contained therein, and it is preferable to suppress entry of moisture ($H_2O$). Thus, it is preferable to use aluminum oxide ($AlO_x$) among the above materials as a material for the first protective layer 51 and the second protective layer 53.

It is to be noted that the first protective layer 51 and the second protective layer 53 may be formed by using a material similar to those of the insulating layer 28 and the interlayer insulating layer 29. For example, the first protective layer 51 and the second protective layer 53 may each include a single-layer film including one of silicon oxide ($SiO_x$), silicon nitride ($SiN_x$), silicon oxynitride ($SiO_xN_y$), and the like or a stacked film including two or more of aluminum oxide ($AlO_x$), silicon nitride ($SiN_x$), a carbon-containing silicon oxide film (SiOC), silicon oxide ($SiO_x$), and silicon oxynitride ($SiO_xN_y$). The first protective layer 51 has a thickness of, for example, 100 nm to 1000 nm. The second protective layer 53 has a thickness of, for example, 10 nm to 1000 nm.

The wiring line 52 is provided on the second protective layer 53 in the peripheral region 110B. The wiring line 52 is electrically coupled to the upper electrode 25, for example, via the opening 51H2 that passes through the first protective layer 51 and the hydrogen-blocking layer 26, as described above. Further, in the peripheral region 110B, the wiring line 52 is electrically coupled to the pad section 36D provided in the interlayer insulating layer 29, via the opening 51H1 that passes through the first protective layer 51, the hydrogen-blocking layer 26, and the insulating layer 22, and forms the guard ring 55. The pad section 36D is coupled to the through electrode 34D which penetrates the via V2, the pad section 35D, and the semiconductor substrate 30, and which is coupled to the wiring layer 41 provided on the second surface (surface 30S2) of the semiconductor substrate 30, thereby functioning as a transmission path for charges (here, holes) generated in the organic photoelectric converter 20.

The light-shielding film 54 is provided on the second protective layer 53 in the peripheral region 110B. Examples of a material of the light-shielding film 54 include tungsten (W), titanium (Ti), titanium nitride (TiN), and aluminum (Al). The light-shielding film 54 is configured, for example, as a stacked film of W/TiN/Ti or a single-layer film of W. The light-shielding film 54 has a thickness of, for example, 50 nm or more and 400 nm or less.

Further, on the second protective layer 53, there is provided the on-chip lens layer 56 in which an on-chip lens 56L (microlens) is formed for each pixel P of the effective pixel region 110A, for example. The on-chip lens 56L condenses light entering from the above to the respective light receiving surfaces of the organic photoelectric converter 20, the inorganic photoelectric converter 32B, and the inorganic photoelectric converter 32R. It is to be noted that there may be provided, below the on-chip lens 56L, an optical member such as a color filter for controlling spectroscopy.

The semiconductor substrate 30 includes, for example, an n-type silicon (Si) substrate and has a p well 31 in a predetermined region (e.g., pixel section 1a). The second surface (surface 30S2) of the p well 31 is provided with the above-described transfer transistors TR1trs, TR2trs, and TR3trs, amplifier transistors TR1amp and TR2amp, reset transistors TR1rst and TR2rst, selection transistors TR1sel and TR2sel, and the like. In addition, the peripheral region 110B of the semiconductor substrate 30 is provided, for example, with a pixel readout circuit and a pixel drive circuit each including a logic circuit or the like.

Figure 5B:
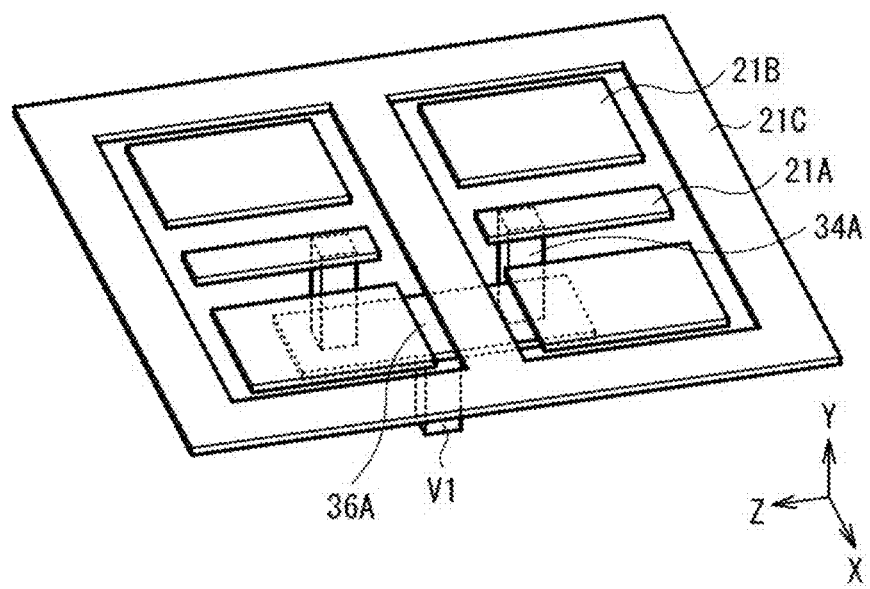
FIG. 5B is a perspective view of the layout of the lower electrode illustrated in FIG. 5A.
Figure 6B:
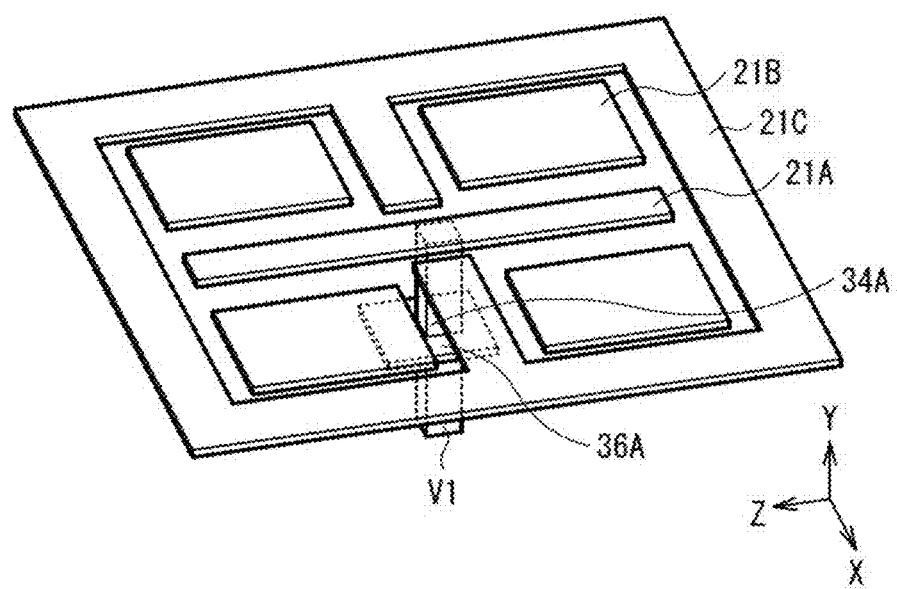
FIG. 6B is a perspective view of the layout of the lower electrode illustrated in FIG. 5A.
Figure 7:
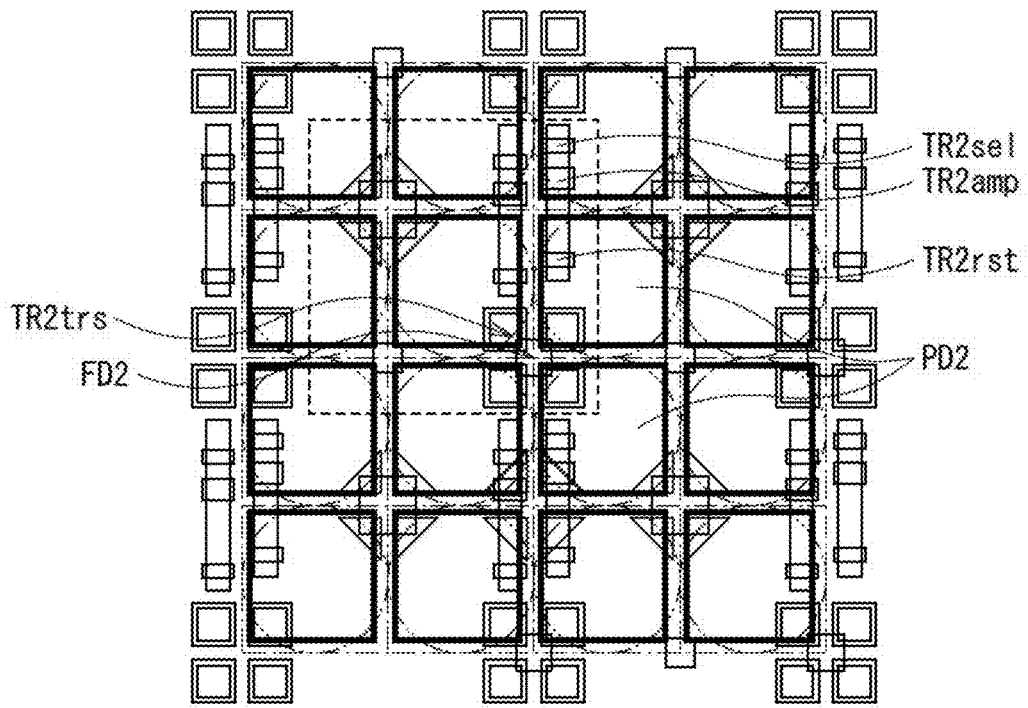
FIG. 7 is a plan schematic view of an example of a layout of one inorganic photoelectric converter and various transistors related thereto illustrated in FIG. 1.
Figure 8:
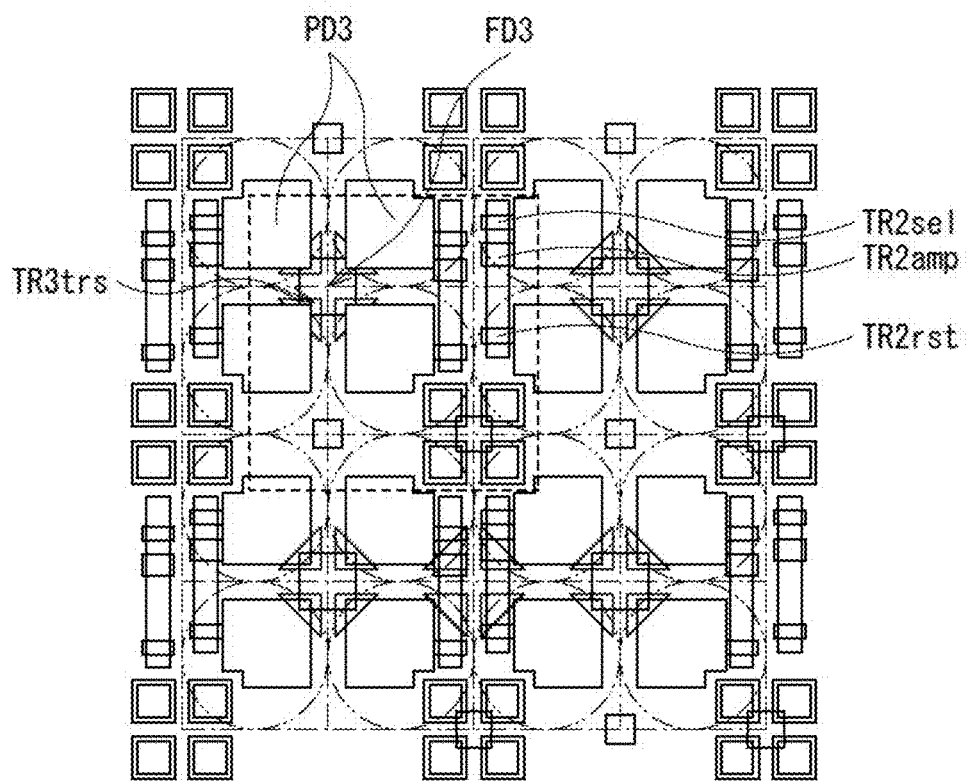
FIG. 8 is a plan schematic view of an example of a layout of another inorganic photoelectric converter and various transistors related thereto illustrated in FIG. 1.
Figure 9:
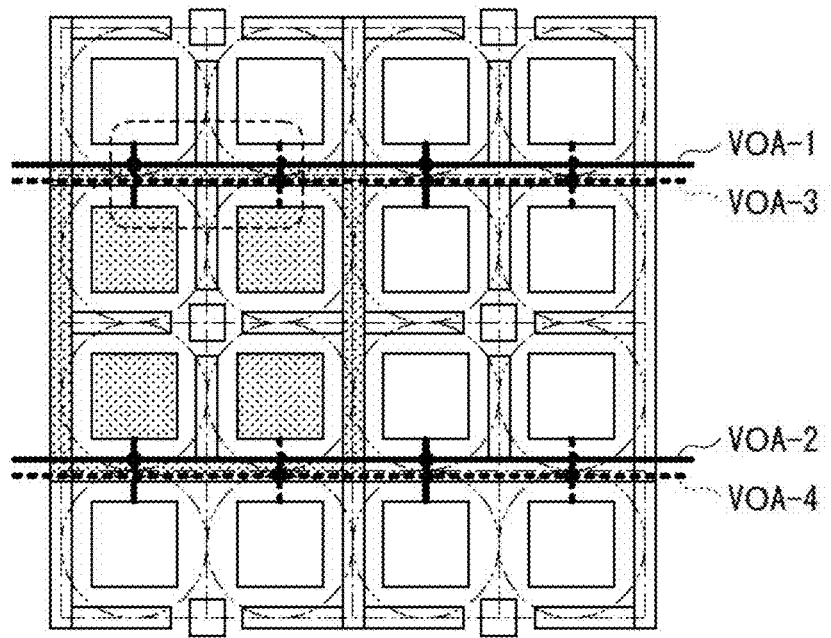
FIG. 9 is a disposition diagram of signal lines for driving an accumulation electrode illustrated in FIG. 1.
Figure 10:
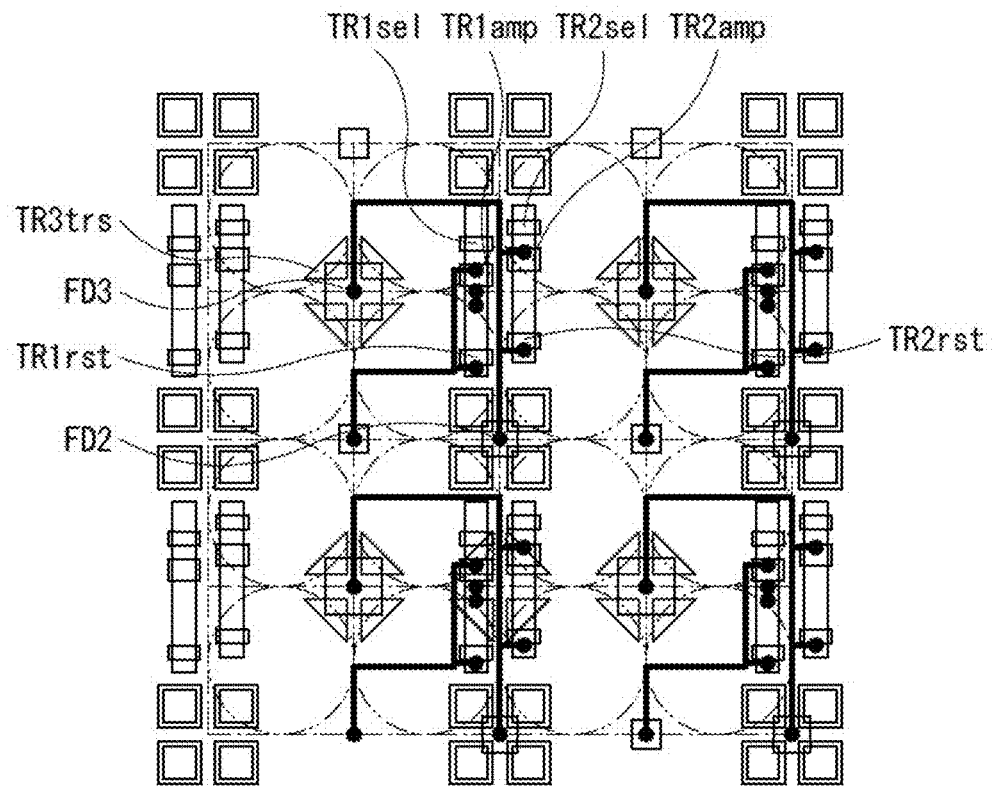
FIG. 10 is a diagram illustrating a portion of wiring lines coupled to photoelectric converters that are adjacent to each other and various transistors related thereto.
Figure 11:
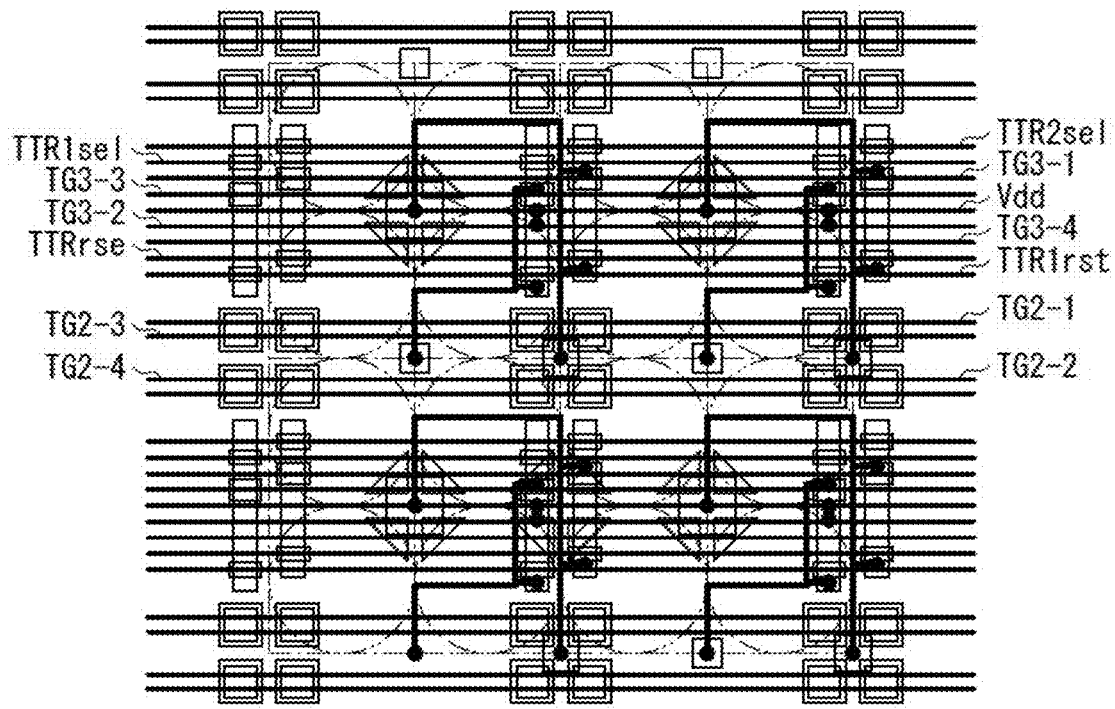
FIG. 11 is a diagram illustrating a portion of wiring lines coupled to photoelectric converters that are adjacent to each other and various transistors related thereto.
Figure 12:
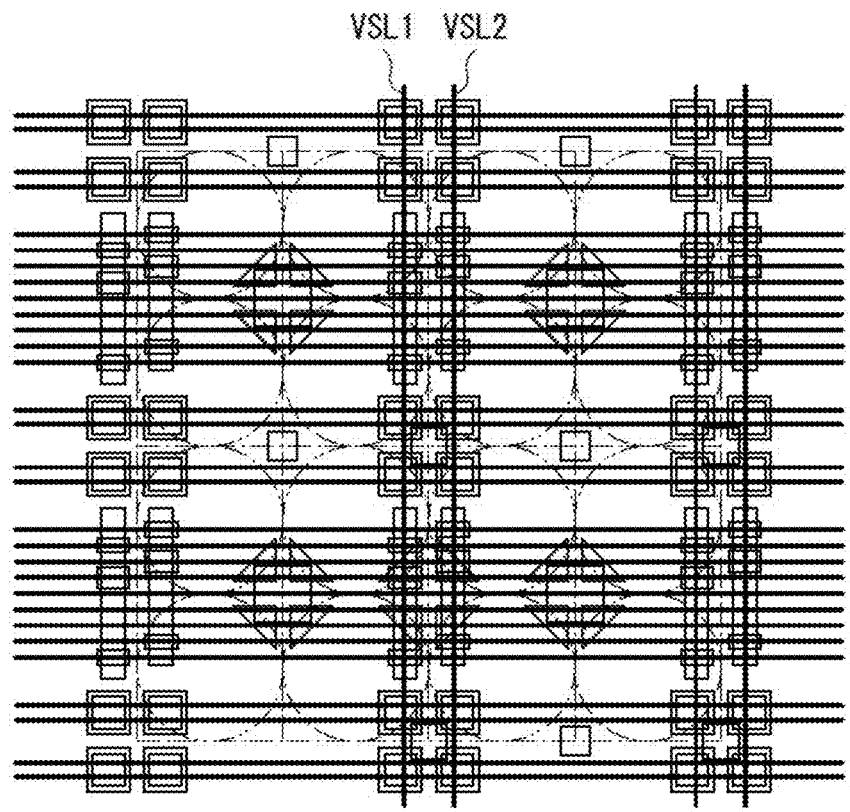
FIG. 12 is a diagram illustrating a portion of wiring lines coupled to photoelectric converters that are adjacent to each other and various transistors related thereto.

The imaging element 10A of the present embodiment has, as described above, a layout in which four pixels that are adjacent to each other share one floating diffusion FD1, one floating diffusion FD2, and one floating diffusion FD3 each corresponding to each of the four pixels. FIG. 5A illustrates an example of a layout of the lower electrode 21 included in the organic photoelectric converter 20, and FIG. 5B illustrates the layout of the lower electrode 21 illustrated in FIG. 5A as a perspective view. FIG. 6A illustrates an example of the layout of the lower electrode 21 included in the organic photoelectric converter 20, and FIG. 6B illustrates the layout of the lower electrode 21 illustrated in FIG. 6A as a perspective view. FIG. 7 illustrates an example of a layout of the inorganic photoelectric converter 32B and various transistors related thereto. FIG. 8 illustrates an example of a layout of the inorganic photoelectric converter R and various transistors related thereto. FIG. 9 illustrates an example of signal lines for driving the accumulation electrode 21B in the organic photoelectric converter 20. FIGS. 10 to 12 each illustrate an example of wiring lines coupled to the photoelectric converters 20, 32B, 32R and various transistors related thereto.

According to the organic photoelectric converter 20 of the present embodiment, four organic photoelectric converters 20 that are adjacent to each other are coupled to one floating diffusion FD1. One reset transistor TR1rst and a power supply line Vdd are coupled in series to the floating diffusion FD1. Further, aside from this, one amplifier transistor TR1amp, one selection transistor TR1sel, and a signal line (data output line) VSL1 are coupled in series to the floating diffusion FD1. According to the organic photoelectric converter 20 of the present embodiment, a set of control section (first control section) that performs a read operation and a reset operation of the four organic photoelectric converters 20 that are adjacent to each other includes: four accumulation electrode 21B that are adjacent to each other; and the reset transistor TR1rst, the amplifier transistor TR1amp, and the selection transistor TR1sel, each of which is provided for each pixel. When a signal charge is read from four organic photoelectric converters 20 that are adjacent to each other, the first control section performs the reading process in order by time division, for example.

According to the inorganic photoelectric converter 32B of the present embodiment, four photodiodes PD2 that are adjacent to each other are coupled to one floating diffusion FD2 via four transfer transistors TR2trs each of which is provided for each pixel.

According to the inorganic photoelectric converter 32R of the present embodiment, similarly to the inorganic photoelectric converter 32B, four photodiodes PD3 that are adjacent to each other are coupled to one floating diffusion FD3 via four transfer transistors TR3trs each of which is provided for each pixel.

One reset transistor TR2rst and the power supply line Vdd are coupled in series to one floating diffusion FD2. Further, aside from this, one amplifier transistor TR2amp, one selection transistor TR2sel, and a signal line (data-output line) VSL2 are coupled in series to the floating diffusion FD2. In the imaging element 10A having the pixel sharing structure as in the present embodiment, the inorganic photoelectric converter 32B and the inorganic photoelectric converter 32R include the transfer transistor TR2trs and the transfer transistor TR3trs provided for each pixel, and one reset transistor TR2rst, one amplifier transistor TR2amp, and one selection transistor TR2sel provided for each pixel, to configure a set of control section (second control section) that performs a read operation and a reset operation of four inorganic photoelectric converters 32B and inorganic photoelectric converters 32R that are adjacent to each other. That is, the four inorganic photoelectric converter 32B and the four inorganic photoelectric converter 32R included in the four-pixel stacked imaging element 10A have a configuration in which one set of control section (second control section) is shared except for the transfer transistors TR2trs and TR3trs. When signal charges are read from the floating diffusion FD2 corresponding to the four inorganic photoelectric converters 32B that are adjacent to each other and the floating diffusion FD3 corresponding to the four inorganic photoelectric converters 32R, the read process is performed in order by time division using the second control section, for example.

In the present embodiment, the floating diffusions FD2 and FD3 shared by the four inorganic photoelectric converters 32B and inorganic photoelectric converters 32R that are adjacent to each other are disposed at positions that are spaced apart from each other by one pixel. This makes it possible to achieve high integration of the imaging element 10A.

1-2. Method of Manufacturing Imaging Element

It is possible to manufacture the imaging element 10A according to the present embodiment, for example, as follows.

First, for example, the p well 31 is formed as a well of a first electrical conduction type in the semiconductor substrate 30. The inorganic photoelectric converters 32B and 32R of a second electrical conduction type (e.g., n-type) are formed in this p well 31. A p+ region is formed in a region near the first surface (surface 30S1) of the semiconductor substrate 30.

For example, n+ regions that serve as the floating diffusions FD1 to FD3 are formed on the second surface (surface 30S2) of the semiconductor substrate 30 and a gate insulating layer 33 and a gate wiring layer 47 are then formed. The gate wiring layer 47 includes the respective gates of the transfer transistors TR1trs, TR2trs, and TR3trs, the selection transistors TR1sel and TR2sel, the amplifier transistors TR1amp and TR2amp, and the reset transistors TR1rst and TR2rst. This forms the transfer transistors TR1trs, TR2trs, and TR3trs, the selection transistors TR1sel and TR2sel, the amplifier transistors TR1amp and TR2amp, and the reset transistors TR1rst and TR2rst. Further, the multilayer wiring line 40 is formed on the second surface (surface 30S2) of the semiconductor substrate 30. The multilayer wiring line 40 includes the wiring layers 41 to 43 and the insulating layer 44. The wiring layers 41 to 43 include the lower first contact 45 and the coupling section 41A.

As the base of the semiconductor substrate 30, for example, an SOI (Silicon on Insulator) substrate is used in which the semiconductor substrate 30, an embedded oxide film (not illustrated), and a holding substrate (not illustrated) are stacked. The embedded oxide film and the holding substrate are joined to the first surface (surface 30S1) of the semiconductor substrate 30. After ion implantation, annealing treatment is performed.

Next, a support substrate (not illustrated), another semiconductor base, or the like is joined to the second surface (surface 30S2) side (multilayer wiring line 40 side) of the semiconductor substrate 30 and flipped vertically. Subsequently, the semiconductor substrate 30 is separated from the embedded oxide film and the holding substrate of the SOI substrate to expose the first surface (surface 30S1) of the semiconductor substrate 30. It is possible to perform the above-described steps with technology used in a normal CMOS process such as ion implantation and CVD (Chemical Vapor Deposition).

Next, the semiconductor substrate 30 is processed from the first surface (surface 30S1) side, for example, by dry etching to form the annular through holes 30H1, 30H2, 30H3, and 30H4, for example. The depth of the through holes 30H1 to 30H4 extend from the first surface (surface 30S1) to the second surface (surface 30S2) of the semiconductor substrate 30.

Next, the fixed charge layer 27 is formed on the first surface (surface 30S1) of the semiconductor substrate 30 and the side surface of the through hole 30H by using, for example, atomic layer deposition (Atomic Layer Deposition; ALD). This forms the fixed charge layer 27 that is continuous over the first surface (surface 30S1) of the semiconductor substrate 30 and the side surfaces and the bottom surfaces of the through holes 30H1, 30H2, 30H3, and 30H4. Next, the insulating layer 28 is formed on the fixed charge layer 27 on the first surface (surface 30S1) of the semiconductor substrate 30 and inside the through holes 30H1, 30H2, 30H3, and 30H4, and then the insulating film that is included in the interlayer insulating layer 29 is further formed on the insulating layer 28.

Next, a through hole is formed, for example, by dry etching in the insulating layer 28 formed inside the through holes 30H1, 30H2, 30H3, and 30H4. The through holes 30H1, 30H2, 30H3, and 30H4 reach the coupling section 41A through the insulating film that is included in the interlayer insulating layer 29, the insulating layer 28, the fixed charge layer 27, and the insulating layer 44. It is to be noted that the insulating film included in the interlayer insulating layer 29 above the first surface (surface 30S1) is also decreased in thickness in this case. Next, an electrically conducive film is formed on the insulating film included in the interlayer insulating layer 29 and inside the through hole 27H and a photoresist PR is then formed at a predetermined position on the electrically conducive film. Afterward, the through electrodes 34A, 34B, 34C, and 34D that respectively include the pad sections 35A, 35B, 35C, and 35D on the first surface (surface 30S1) of the semiconductor substrate 30 are formed by etching and removing the photoresist PR.

Next, the via V2, the pad sections 36, 36B, 36C, and 36D, and the via V1 are formed on the insulating film included in the interlayer insulating layer 29 and the through electrodes 34A, 34B, 34C, and 34D, and the surface of the interlayer insulating layer 29 is planarized by using CMP (Chemical Mechanical Polishing). Subsequently, an electrically conductive film is formed on the interlayer insulating layer 29 and a photoresist PR is then formed at a predetermined position on the electrically conducive film. Afterward, the readout electrode 21A, the accumulation electrode 21B, and the shield electrode 21C are formed by etching and removing the photoresist PR. Next, the insulating layer 22 is formed on the interlayer insulating layer 29, the readout electrode 21A, the accumulation electrode 21B, and the shield electrode 21C, and the opening 22H is then provided on the readout electrode 21A. Subsequently, the charge accumulation layer 23, the photoelectric conversion layer 24, and the upper electrode 25 are formed on the insulating layer 22.

It is to be noted that, in a case where the charge accumulation layer 23 and another organic layer are formed by using organic materials, it is preferable that the charge accumulation layer 23 and the other organic layer be formed continuously (in an in-situ vacuum process) in a vacuum step. In addition, the method of forming the photoelectric conversion layer 24 is not necessarily limited to a method in which vacuum evaporation is used. Another method, for example, spin coating technology, printing technology, or the like may be used.

Figure 13:
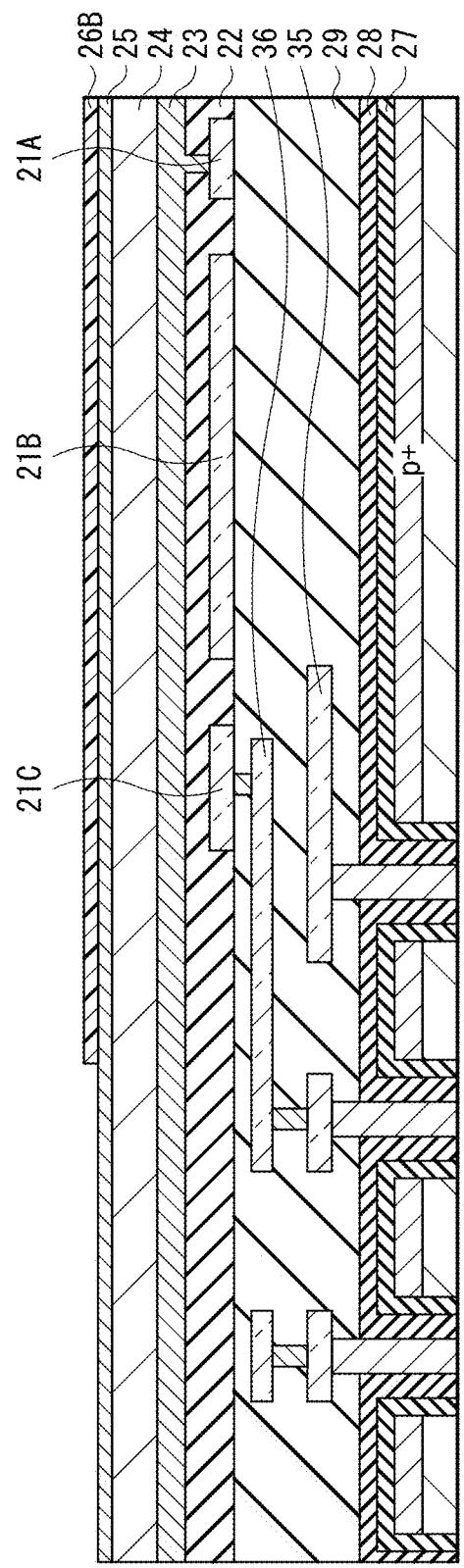
FIG. 13 is a cross-sectional view for describing a method of manufacturing the imaging element illustrated in FIG. 1.

Subsequently, as illustrated in FIG. 13, an aluminum oxide ($AlO_x$) film 26B, for example, is formed as a hard mask on the upper electrode 25 in the effective pixel region 110A to a thickness of 10 nm to 50 nm, for example, by using a physical vapor deposition (PVD) method. It is to be noted that the method of forming the film is not limited thereto, and for example, a CVD method or an ALD method may be used. As the method of forming the film using the PVD method, there are given, for example, an EB (electron beam) evaporation method, various sputtering methods (a magnetron sputtering method, an RF-DC coupled bias sputtering method, an ECR sputtering method, a facing target sputtering method, a high-frequency sputtering method), and the like. In particular, in a case where a surface roughness of the upper electrode 25 is large, it is preferable to form a film by using a CVD/ALD method having excellent coverage. However, a film formation rate of the CVD/ALD method is remarkably lower than that of the PVD method. For this reason, it is preferable to use a PVD method as long as it is possible to sufficiently cover the upper electrode 25 by the PVD method. Next, the $AlO_x$ film 26B is patterned using, for example, a lithographic method to form a hard mask. It is to be noted that, in FIG. 14, which will be described later, an example in which the photoresist PR is removed is illustrated, but the resist may be left behind after the $AlO_x$ film 26B has been patterned and the next step may be performed.

Figure 14:
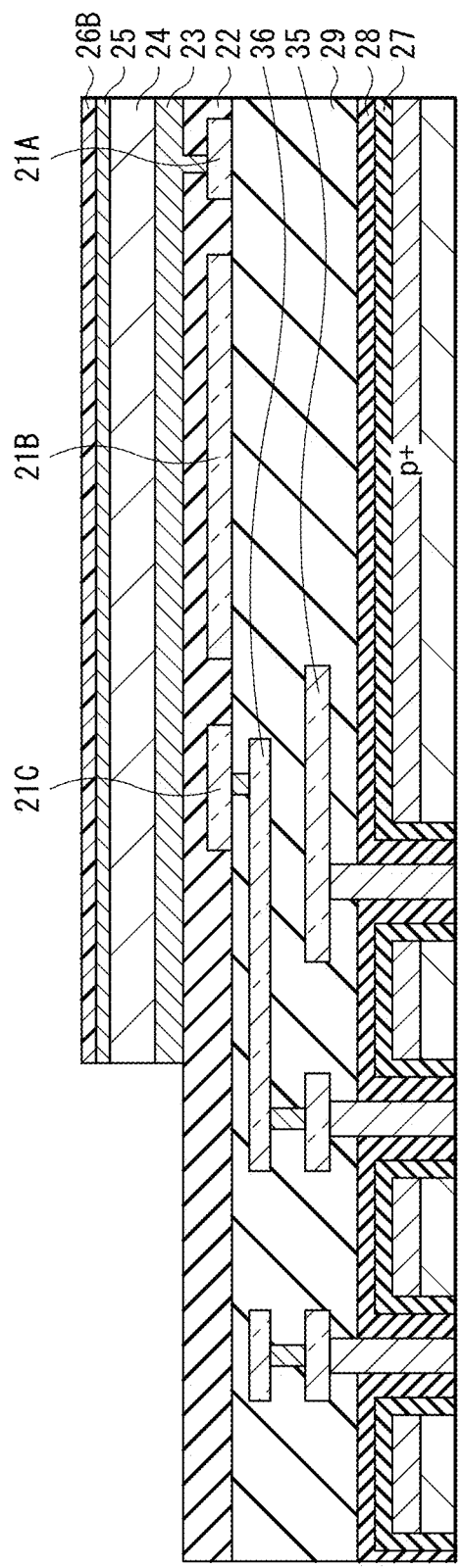
FIG. 14 is a cross-sectional view of a step subsequent to FIG. 13.
Figure 15:
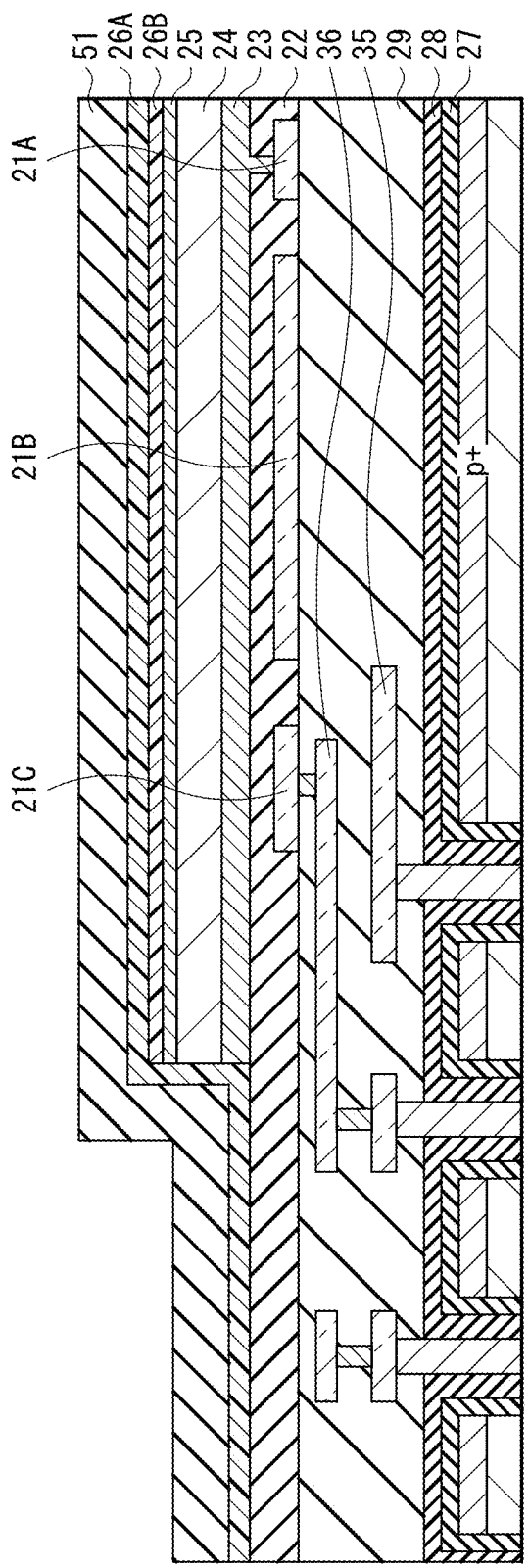
FIG. 15 is a cross-sectional view of a step subsequent to FIG. 14.

Next, as illustrated in FIG. 14, the charge accumulation layer 23, the photoelectric conversion layer 24, and the upper electrode 25 formed in the peripheral region 110B are etched. Subsequently, as illustrated in FIG. 15, an $AlO_x$ film 26A is formed to a thickness of 50 nm to 1000 nm, for example, by the PVD method, for example. Thus, the hydrogen-blocking layer 26 including the $AlO_x$ films 26A and 26B are formed. It is to be noted that the $AlO_x$ film 26A may be formed by using the CVD method or the ALD method as in the case of the $AlO_x$ film 26B, and for example, it is preferable to use the CVD/ALD method which is excellent in coverage in a case where a step difference between the charge accumulation layer 23, the photoelectric conversion layer 24, and the upper electrode 25 is large, and to use the PVD method in a case where a high film formation rate and a stress control of the semiconductor substrate 30 are prioritized. In addition, the PVD method and the CVD/ALD method may be combined to form the hydrogen-blocking layer 26 including the stacked film.

Figure 16:
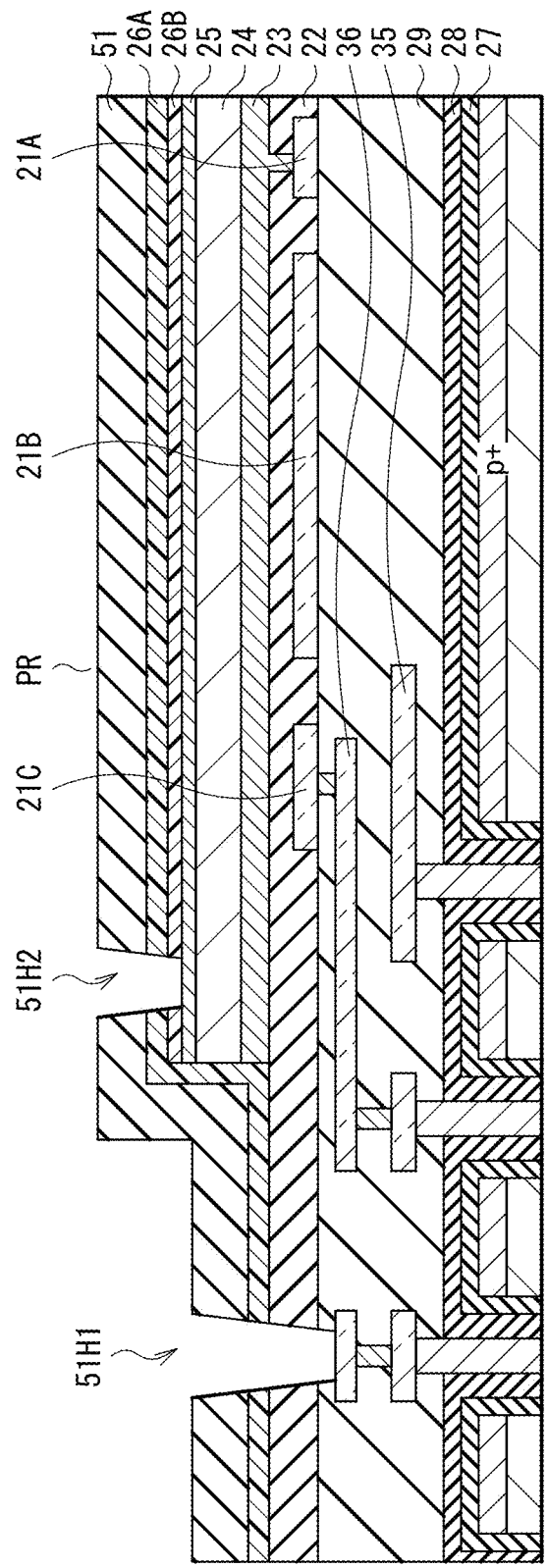
FIG. 16 is a cross-sectional view of a step subsequent to FIG. 15.

Subsequently, as illustrated in FIG. 16, after forming the first protective layer 51, the photoresist PR is patterned on the first protective layer 51 to form the opening 51H1 that penetrates to the pad section 36D that is electrically coupled to the through electrode 34D in the peripheral region 110B. Next, the opening 51H2 that penetrates to the upper electrode 25 is formed. It is to be noted that the order of forming the opening 51H1 and the opening 51H2 is not limited thereto, and, for example, the opening 51H1 and the opening 51H2 may be formed at the same time. Thereafter, the wiring line 52 that is continuous over the first protective layer 51 and the side surfaces and the bottom surfaces of the openings 51H1 and 51H2 is formed. After that, the second protective layer 53 is formed over the first protective layer 51 and the wiring line 52, and the second protective layer 53 buries the openings 51H1 and 51H2. This suppresses the entry of hydrogen and moisture into the charge accumulation layer 23 via the openings 51H1 and 51H2. Finally, the light-shielding film 54 and the on-chip lens layer 56 are formed. As described above, the imaging element 10A illustrated in FIG. 1 is completed.

When light enters the organic photoelectric converter 20 via the on-chip lens 56L in the imaging element 10A, the light passes through the organic photoelectric converter 20 and the inorganic photoelectric converters 32B and 32R in order. While the light passes through the organic photoelectric converter 20 and the inorganic photoelectric converters 32B and 32R, the light is photoelectrically converted for each of green light, blue light, and red light. The following describes an operation of acquiring signals of the respective colors.

(Acquisition of Green Color Signal by Organic Photoelectric Converter 20)

First, green light of the pieces of light having entered the imaging element 10A is selectively detected (absorbed) by the organic photoelectric converter 20 to be subjected to photoelectric conversion.

The organic photoelectric converter 20 is coupled to the gate Gamp of the amplifier transistor AMP and the floating diffusion FD1 via the through electrode 34. Thus, the electrons of the electron-hole pairs generated in the organic photoelectric converter 20 are taken out from the lower electrode 21 side, transferred to the second surface (surface 30S2) side of the semiconductor substrate 30 via the through electrode 34, and accumulated in the floating diffusion FD1. At the same time as this, the amplifier transistor AMP modulates the amount of charges generated in the organic photoelectric converter 20 to a voltage.

In addition, the reset gate Grst of the reset transistor TR1rst is disposed next to the floating diffusion FD1. This causes the reset transistor TR1rst to reset the charges accumulated in the floating diffusion FD1.

Here, the organic photoelectric converter 20 is coupled to not only the amplifier transistor TR1amp, but also the floating diffusion FD1 via the through electrode 34A, allowing the reset transistor TR1rst to easily reset the charges accumulated in the floating diffusion FD1.

In contrast, in a case where the through electrode 34A and the floating diffusion FD1 are not coupled, it is difficult to reset the charges accumulated in the floating diffusion FD1, resulting in application of a large voltage to pull out the charges to the upper electrode 25 side. The photoelectric conversion layer 24 may be thus damaged. In addition, a structure that enables resetting in a short period of time leads to increased dark-time noise and results in a trade-off. This structure is thus difficult.

Figure 17:
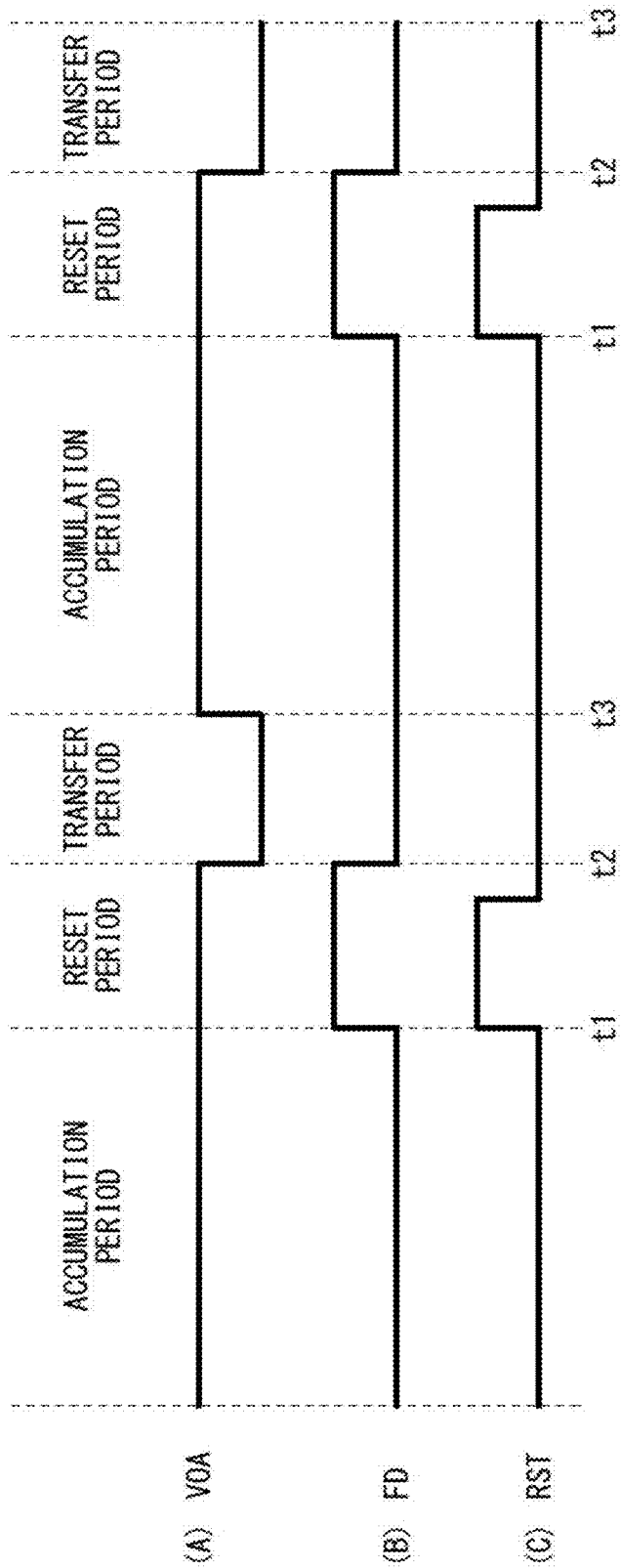
FIG. 17 is a timing chart illustrating an operation example of the imaging element illustrated in FIG. 1.

FIG. 17 illustrates an operation example of the imaging element 10A. (A) illustrates a potential at the accumulation electrode 21B, (B) illustrates a potential at the floating diffusion FD1 (readout electrode 21A), and (C) illustrates a potential at the gate (Gsel) of the reset transistor TR1rst. In the imaging element 10A, voltages are individually applied to the readout electrode 21A and the accumulation electrode 21B.

In the imaging element 10A, in an accumulation period, the drive circuit applies a potential V1 to the readout electrode 21A and applies a potential V2 to the accumulation electrode 21B. Here, it is assumed that the potentials V1 and V2 satisfy V2>V1. This causes charges (electrons here) generated through photoelectric conversion to be attracted to the accumulation electrode 21B and accumulated in the region of the charge accumulation layer 23 opposed to the accumulation electrode 21B (accumulation period). Incidentally, the potential of the region of the charge accumulation layer 23 opposed to the accumulation electrode 21B has a value that is more negative with the passage of time of photoelectric conversion. It is to be noted that holes are sent from the upper electrode 25 to the drive circuit.

In the imaging element 10A, a reset operation is performed in the second portion of the accumulation period. Specifically, at timing t1, a scanning section changes the voltage of a reset signal RST from a low level to a high level. This turns on the reset transistor TR1rst in the unit pixel P. As a result, the voltage of the floating diffusion FD1 is set at a power supply voltage VDD and the voltage of the floating diffusion FD1 is reset (reset period).

After the reset operation is completed, the charges are read out. Specifically, at timing t2, the drive circuit applies a potential V3 to the readout electrode 21A and applies a potential V4 to the accumulation electrode 21B. Here, it is assumed that the potentials V3 and V4 satisfy V3<V4. This causes the charges (electrons here) accumulated in the region corresponding to the accumulation electrode 21B to be read out from the readout electrode 21A to the floating diffusion FD1. That is, the charges accumulated in the charge accumulation layer 23 are read out to the control section (transfer period).

After the read operation is completed, the drive circuit applies the potential V1 to the readout electrode 21A and applies the potential V2 to the accumulation electrode 21B again. This causes charges (electrons here) generated through photoelectric conversion to be attracted to the accumulation electrode 21B and accumulated in the region of the photoelectric conversion layer 24 opposed to the accumulation electrode 21B (accumulation period).

(Acquisition of Blue Color Signal and Red Color Signal by Inorganic Photoelectric Converters 32B and 32R)

Next, blue light and red light of the pieces of light having passed through the organic photoelectric converter 20 are absorbed and photoelectrically converted in order by the inorganic photoelectric converter 32B and the inorganic photoelectric converter 32R, respectively. In the inorganic photoelectric converter 32B, the electrons corresponding to the incident blue light are accumulated in an n region of the inorganic photoelectric converter 32B and the accumulated electrons are transferred to the floating diffusion FD2 by the transfer transistor TR2trs. Similarly, in the inorganic photoelectric converter 32R, the electrons corresponding to the incident red light are accumulated in an n region of the inorganic photoelectric converter 32R and the accumulated electrons are transferred to the floating diffusion FD3 by the transfer transistor TR3trs.

1-3. Workings and Effects

As described above, for an imaging device such as a CCD image sensor or a CMOS image sensor, a stacked imaging element has recently been used which is able to extract R/G/B signals from one pixel and necessitates no demosaic process, thereby not generating false color. The stacked imaging element has a configuration in which an organic photoelectric converter including an organic photoelectric conversion layer using containing a semiconductor material is stacked on a semiconductor substrate in which a photodiode is buried.

However, in the stacked imaging element as described above, the charges generated in the organic photoelectric converter are directly accumulated in the floating diffusion layer FD. Thus, it is difficult to completely deplete the organic photoelectric converter, thereby increasing kTC noise, increasing random noise, and causing deterioration of a captured image quality. Accordingly, developed as a stacked imaging element that is able to completely deplete a charge accumulation section of the organic photoelectric converter is an imaging element provided with a charge accumulation electrode. The charge accumulation electrode is disposed, in an organic photoelectric converter disposed above a semiconductor substrate, on one electrode (e.g., first electrode) side of a pair of electrodes (first electrode and second electrode) disposed oppositely to each other with the organic photoelectric conversion layer interposed therebetween, is disposed spaced apart from the first electrode, and is disposed oppositely to the organic photoelectric conversion layer via an insulating layer.

In this imaging element, the organic photoelectric conversion layer has a stacked structure of, for example, a lower semiconductor layer including an oxide semiconductor material and an upper photoelectric conversion layer including an organic semiconductor material, whereby it is possible to prevent recombination of charges accumulated in the organic photoelectric conversion layer and to increase a transfer efficiency to the first electrode. However, the oxide semiconductor material included in the lower semiconductor layer tends to be reduced by hydrogen, and this may cause oxygen defects and lower operation stability.

In contrast, the imaging element 10A according to the present embodiment is provided with the hydrogen-blocking layer 26 above the charge accumulation layer 23 and the photoelectric conversion layer 24 which are formed to extend in the effective pixel region 110A as a common layer for the plurality of unit pixels P provided in the effective pixel region 110A, more specifically, on the upper electrode 25 which is also formed to extend in the effective pixel region 110A. This hydrogen-blocking layer 26 is provided, for example, on the entire surface of the effective pixel region 110A and the peripheral region 110B. The hydrogen-blocking layer 26 has a structure that covers the upper surface of the upper electrode 25 and the side surfaces of the upper electrode 25, the photoelectric conversion layer 24, and the charge accumulation layer 23, is stacked, in the peripheral region 110B, directly on the insulating layer 22, for example.

As described above, in a case where the oxide semiconductor material is used for the lower semiconductor layer, the oxide semiconductor material is reduced by hydrogen, and oxygen defects are generated. As a result, leakage current may increase, charge accumulation, transfer failure, or the like may occur. The lower semiconductor layer corresponds to the charge accumulation layer 23 according to the present embodiment. In the present embodiment, as described above, the hydrogen-blocking layer 26 is provided on the entire surface of the effective pixel region 110A and the peripheral region 110B, covers the upper surface of the upper electrode 25, the side surfaces of the upper electrode 25, the photoelectric conversion layer 24, and the charge accumulation layer 23, is directly stacked, in peripheral region 110B, on the insulating layer 22, for example. Thus, the entry of hydrogen ($H_2$) into the charge accumulation layer 23 is suppressed.

As described above, in this embodiment, the hydrogen-blocking layer 26 is provided for sealing above the charge accumulation layer 23 and the photoelectric conversion layer 24 that are formed to extend in the effective pixel region 110A and the side surfaces thereof; therefore, the entry of hydrogen into the charge accumulation layer 23 is suppressed. Accordingly, the generation of oxygen defects in the charge accumulation layer 23 is reduced, and the operation stability is increased. That is, it is possible to improve the reliability of the imaging element 10A and the imaging device 1 including the imaging element 10A.

Further, in the present embodiment, by forming the hydrogen-blocking layer 26 using a material which can form a film having, in addition to a small amount of hydrogen contained therein, a small amount of moisture contained therein, the entry of moisture ($H_2O$) into the photoelectric conversion layer 24 is suppressed and it becomes possible to prevent deterioration of the photoelectric conversion layer 24.

Still further, in the present embodiment, the first protective layer 51 and the second protective layer 53 are provided over the hydrogen-blocking layer 26, and the second protective layer 53 is embedded, for example, in the opening 51H1 that passes through the first protective layer 51, the hydrogen-blocking layer 26, and the insulating layer 22 and in the opening 51H2 that passes through the first protective layer 51 and the hydrogen-blocking layer 26. This suppresses the entry of hydrogen and moisture into the charge accumulation layer 23 via the openings 51H1 and 51H2. Also, the entry of moisture ($H_2O$) into the photoelectric conversion layer 24 is suppressed, which makes it possible to prevent deterioration of the photoelectric conversion layer 24. Therefore, it is possible to further improve the reliability of the imaging element 10A and the imaging device 1 including the imaging element 10A.

Next, second to fourth embodiments and a modification example will be described. It is to be noted that components corresponding to those of the imaging element 10A according to the first embodiment are denoted by the same reference numerals, and descriptions thereof are omitted.

2. Second Embodiment

Figure 18:
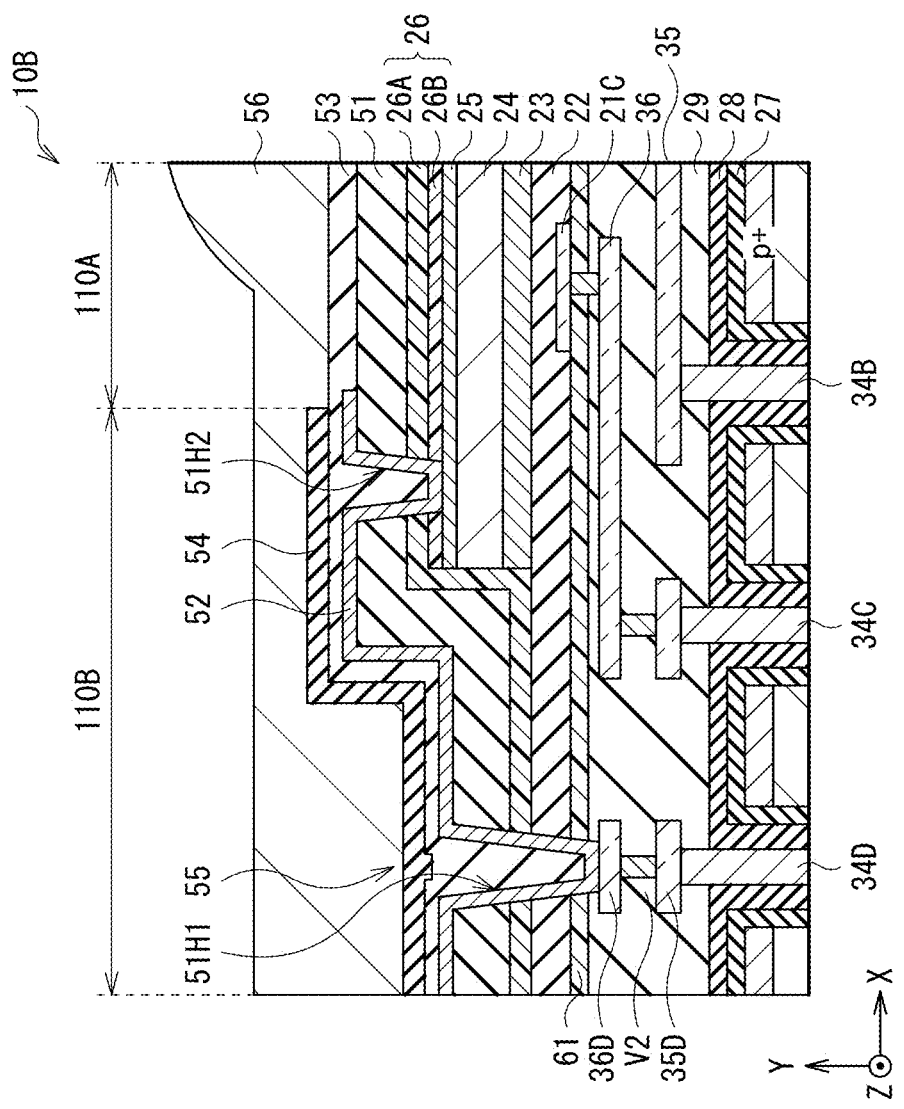
FIG. 18 is a cross-sectional schematic diagram illustrating a configuration of a main part of an imaging element according to a second embodiment of the present disclosure.

FIG. 18 is a cross-sectional schematic diagram illustrating a configuration of a main part of an imaging element (imaging element 10B) according to a second embodiment of the present disclosure. The imaging element 10B is included, for example, in one pixel (unit pixel P) in the imaging device 1 such as a CMOS image sensor included in an electronic apparatus such as a digital still camera or a video camera, as with the above-described first embodiment. The imaging element 10B according to the present embodiment further includes a hydrogen-blocking layer 61 (second hydrogen-blocking layer) in a lower layer of the lower electrode 21, for example, on the interlayer insulating layer 29.

The hydrogen-blocking layer 61 is provided on the interlayer insulating layer 29 as described above, for example, on the entire surface of the effective pixel region 110A and the peripheral region 110B, and is for suppressing the entry of hydrogen ($H_2$) from below the charge accumulation layer 23. As a material included in the hydrogen-blocking layer 61, there is given an insulating material. Specifically, it is preferable to use a material having light transmissivity and a high sealing property, and examples of such a material include aluminum oxide ($AlO_x$), silicon nitride ($SiN_x$), a carbon-containing silicon oxide film (SiOC), and the like. In addition, it is preferable that the hydrogen-blocking layer 61 have a lower hydrogen content than, for example, the insulating layer 22, or that the film itself do not contain hydrogen. In addition, the hydrogen-blocking layer 61 has a small stress. Thus, it is preferable to use aluminum oxide ($AlO_x$) among the above materials as a material for the hydrogen-blocking layer 61. The hydrogen-blocking layer 61 has a thickness of, for example, 10 nm or more and 1000 nm or less.

As described above, in the present embodiment, in addition to the hydrogen-blocking layer 26 that is provided on the upper electrode 25 and covers the side surface thereof and the side surfaces of the charge accumulation layer 23 and the photoelectric conversion layer 24, the hydrogen-blocking layer 61 is provided in the lower layer of the lower electrode 21. Thus, it is possible to suppress the entry of hydrogen ($H_2$) into the charge accumulation layer 23 from the lower electrode 21 side. Accordingly, it is possible to further improve the reliability of the imaging element 10B and the imaging device 1 including the imaging element 10B.

It is to be noted that, in the present embodiment, although an example in which the hydrogen-blocking layer 61 provided in the lower layer of the lower electrode 21 is provided on the interlayer insulating layer 29 immediately below the lower electrode 21, the present disclosure is not limited thereto. The hydrogen-blocking layer 61 may be provided between the semiconductor substrate 30 and the lower electrode 21, and may be formed in the interlayer insulating layer 29, for example.

3. Third Embodiment

Figure 19:
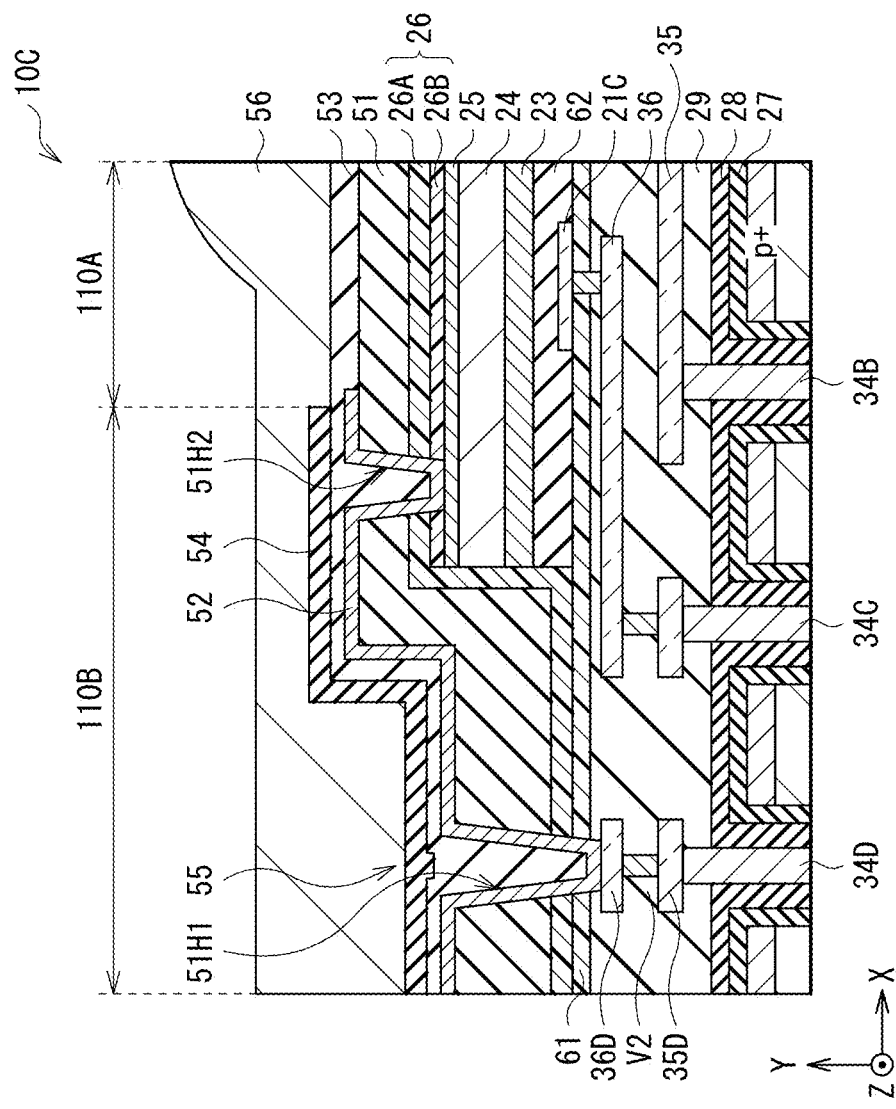
FIG. 19 is a cross-sectional schematic diagram illustrating a configuration of a main part of an imaging element according to a third embodiment of the present disclosure.

FIG. 19 is a cross-sectional schematic diagram illustrating a configuration of a main part of an imaging element (imaging element 10C) according to a third embodiment of the present disclosure. The imaging element 10C is included, for example, in one pixel (unit pixel P) in the imaging device 1 such as a CMOS image sensor included in an electronic apparatus such as a digital still camera or a video camera, as with the above-described first embodiment. The imaging element 10C according to the present embodiment includes, instead of the insulating layer 22 according to the second embodiment, an insulating layer 62 which electrically insulates between the lower electrode 21 and the charge accumulation layer 23 and has the same side surface as the side surfaces of the charge accumulation layer 23, the photoelectric conversion layer 24, and the upper electrode 25 in peripheral region 110B, for example.

The insulating layer 62 is for electrically insulating the charge accumulation layer 23 from the accumulation electrode 21B and the shield electrode 21C, as with the insulating layer 22 described above. The insulating layer 62 is provided over the interlayer insulating layer 29 and the lower electrode 21, for example, so as to cover the lower electrode 21, and forms the same side surface as the side surfaces of the charge accumulation layer 23, the photoelectric conversion layer 24, and the upper electrode 25 in the peripheral region 110B, as described above. Further, although not illustrated, the insulating layer 62 is provided with an opening on the readout electrode 21A of the lower electrode 21, and the readout electrode 21A and the charge accumulation layer 23 are electrically coupled to each other via the opening, similarly to the above-described insulating layer 22. The insulating layer 62 may include a single-layer film including one of silicon oxide ($SiO_x$), silicon nitride ($SiN_x$), silicon oxynitride ($SiO_xN_y$), and the like or a stacked film including two or more of aluminum oxide ($AlO_x$), silicon nitride ($SiN_x$), carbon-containing silicon oxide (SiOC), silicon oxide ($SiO_x$), and silicon oxynitride ($SiO_xN_y$), for example. The insulating layer 62 has a thickness of, for example, 20 nm to 500 nm.

As described above, in the present embodiment, the insulating layer 62 is formed which electrically insulates the charge accumulation layer 23 from the accumulation electrode 21B and the shield electrode 21C, and has the same side surface as the side surfaces of the charge accumulation layer 23, the photoelectric conversion layer 24, and the upper electrode 25 in the peripheral region 110B. Thus, as described above, when the $AlO_x$ film is formed using, for example, the ALD method, the $AlO_x$ film is formed on the side surfaces of the upper electrode 25, the photoelectric conversion layer 24, the charge accumulation layer 23, and the insulating layer 62 and on the hydrogen-blocking layer 61 which formed on the interlayer insulating layer 29. In other words, in the imaging element 10C according to the present embodiment, the hydrogen-blocking layer 26 and the hydrogen-blocking layer 61 are directly stacked in the peripheral region 110B. Accordingly, the organic photoelectric converter 20 including the charge accumulation layer 23 is sealed by the hydrogen-blocking layer 26 and the hydrogen-blocking layer 61; therefore, it becomes possible to further suppress the entry of hydrogen ($H_2$) into the charge accumulation layer 23 as compared to the imaging elements 10A and 10B of the first embodiment and the second embodiment described above, and it is possible to further improve the reliability of the imaging element 10C and the imaging device 1 including the imaging element 10C.

4. Fourth Embodiment

Figure 20:
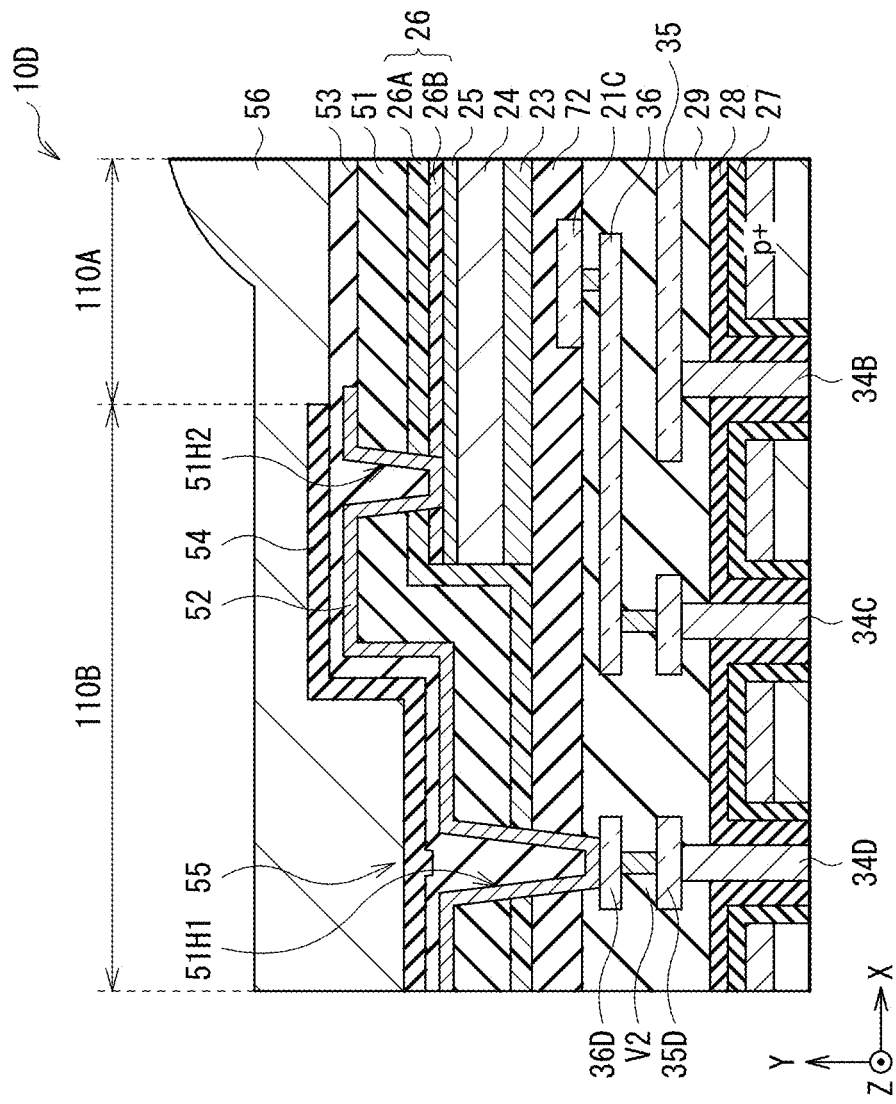
FIG. 20 is a cross-sectional schematic diagram illustrating a configuration of a main part of an imaging element according to a fourth embodiment of the present disclosure.

FIG. 20 is a cross-sectional schematic diagram illustrating a configuration of a main part of an imaging element (imaging element 10D) according to a fourth embodiment of the present disclosure. The imaging element 10D is included, for example, in one pixel (unit pixel P) in the imaging device 1 such as a CMOS image sensor included in an electronic apparatus such as a digital still camera or a video camera, as with the above-described first embodiment. The imaging element 10D according to the present embodiment is provided with an insulating layer 72 using a similar material as those of the hydrogen-blocking layer 26 and the hydrogen-blocking layer 61 as the insulating layer that electrically insulates between the lower electrode 21 and the charge accumulation layer 23 in the above first embodiment.

The insulating layer 72 is for electrically insulating the charge accumulation layer 23 from the accumulation electrode 21B and the shield electrode 21C, and for suppressing the entry of hydrogen ($H_2$) from below the charge accumulation layer 23, as with the insulating layer 22 described above. As a material included in the insulating layer 72, it is preferable to have light transmissivity and a high sealing property, as with the case of the hydrogen-blocking layer 26 and the hydrogen-blocking layer 61. Further, a dense film with few defects is preferable. An example of such a material includes aluminum oxide ($AlO_x$).

As described above, in the present embodiment, the insulating layer 72 that electrically insulates the charge accumulation layer 23 from the accumulation electrode 21B and the shield electrode 21C is formed using, for example, aluminum oxide ($AlO_x$); therefore, a function as a hydrogen-blocking layer is added to the insulating layer 72, and it becomes possible to suppress the entry of hydrogen ($H_2$) from below the charge accumulation layer 23. Accordingly, it becomes possible to further suppress the entry of hydrogen ($H_2$) into the charge accumulation layer 23 as compared to the imaging elements 10A and 10B of the first embodiment and the second embodiment described above. Therefore, it is possible to further improve the reliability of the imaging element 10D and the imaging device 1 including the imaging element 10D.

5. Modification Example

Figure 21:
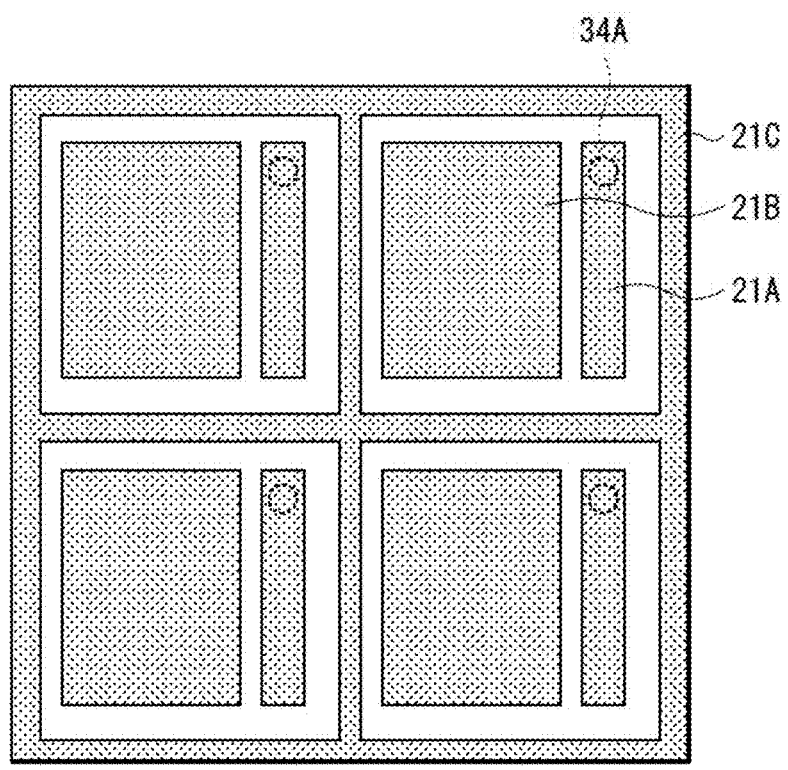
FIG. 21 is a plan schematic view of another example of a layout a lower electrode included in an organic photoelectric converter according to a modification example of the present disclosure.
Figure 22:
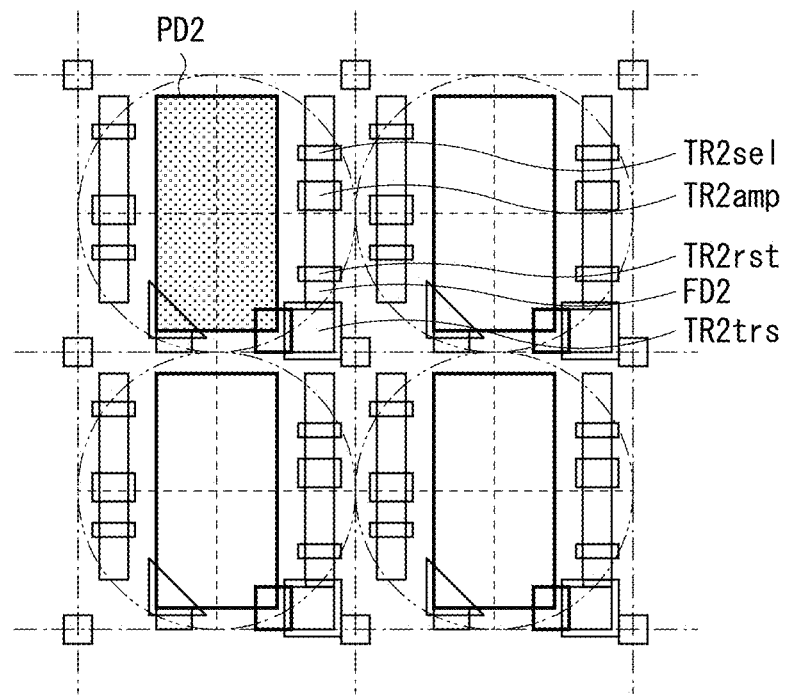
FIG. 22 is a plan schematic view of another example of a layout of one inorganic photoelectric converter and various transistors related thereto according to the modification example of the present disclosure.
Figure 23:
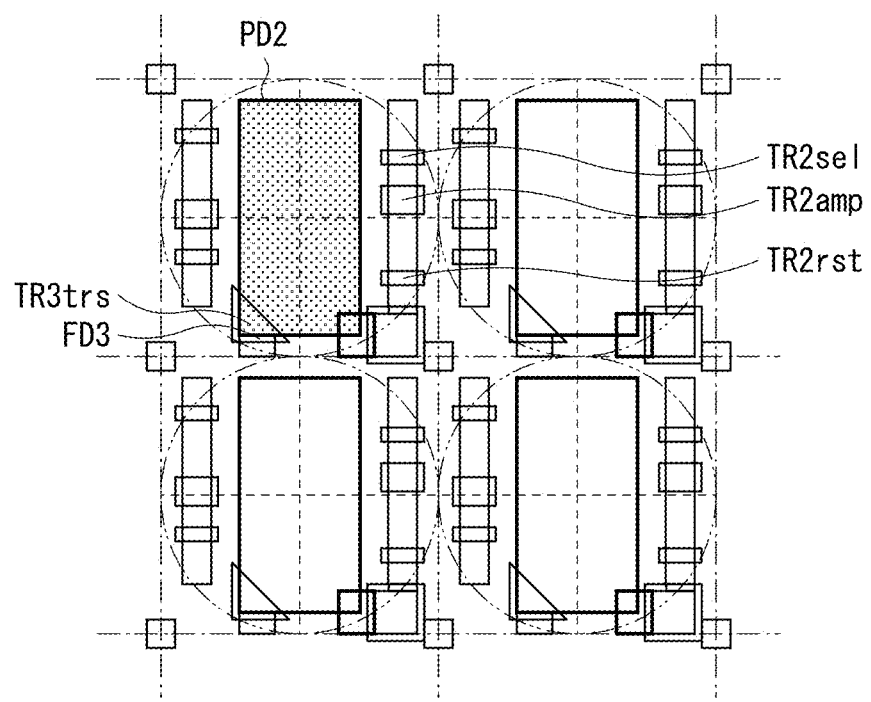
FIG. 23 is a plan schematic view of another example of a layout of another inorganic photoelectric converter and various transistors related thereto according to the modification example of the present disclosure.
Figure 24:
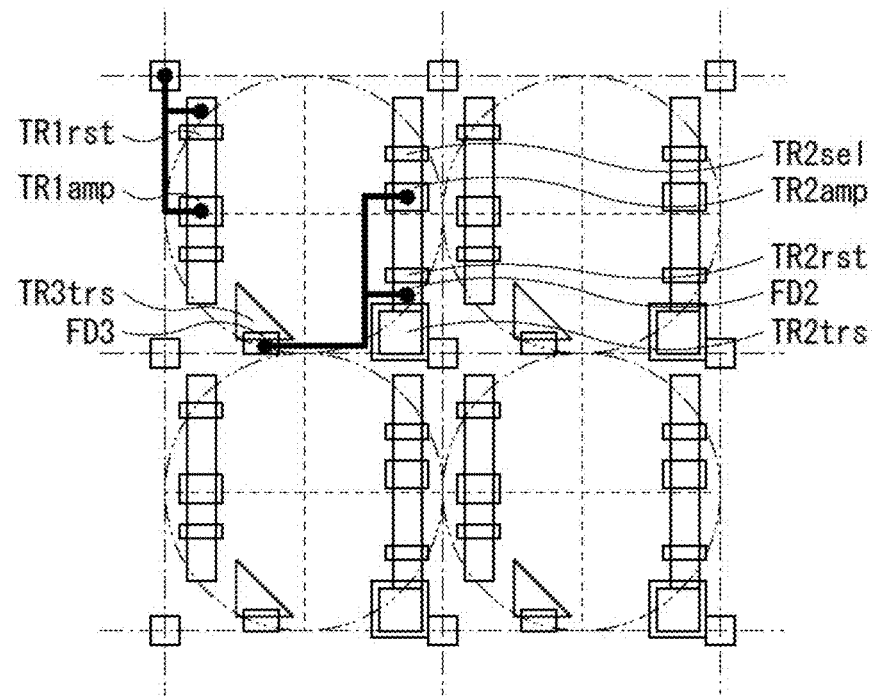
FIG. 24 is a diagram illustrating another example of wiring lines coupled to photoelectric converters and various transistors related thereto according to the modification example of the present disclosure.
Figure 25:
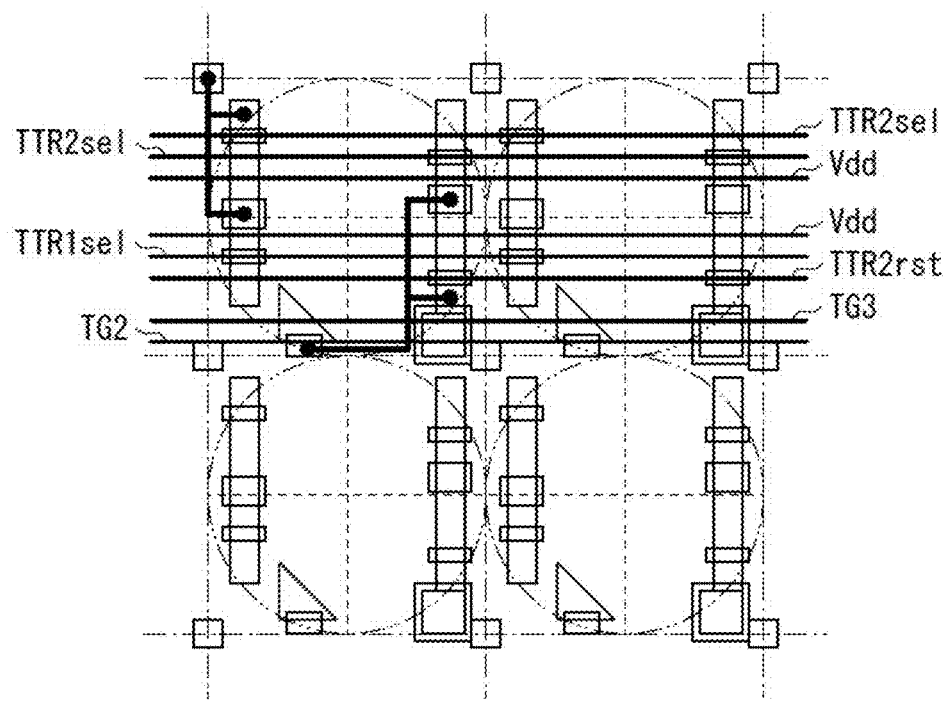
FIG. 25 is a diagram illustrating another example of the wiring lines coupled to the photoelectric converters and the various transistors related thereto according to the modification example of the present disclosure.
Figure 26:
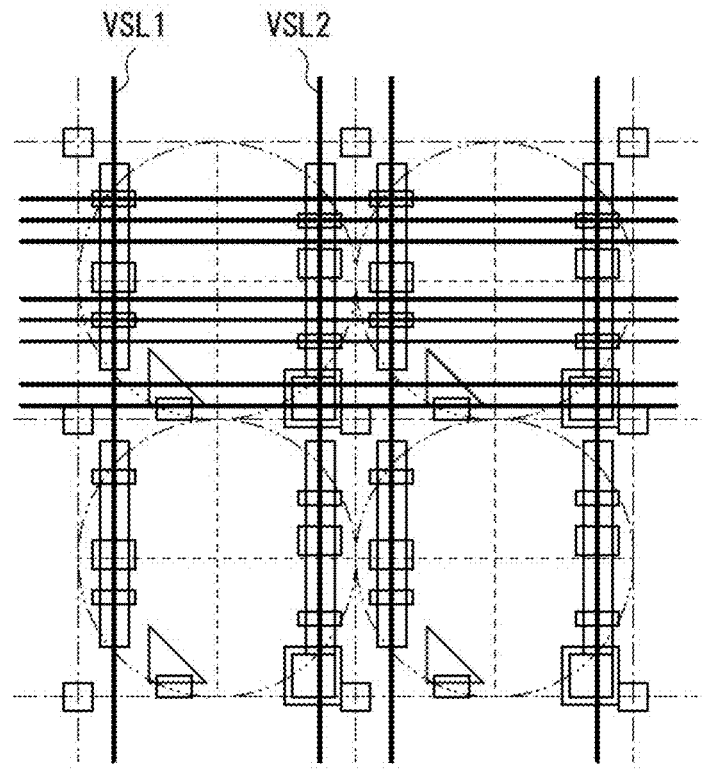
FIG. 26 is a diagram illustrating another example of the wiring lines coupled to the photoelectric converters and the various transistors related thereto according to the modification example of the present disclosure.
Figure 27:
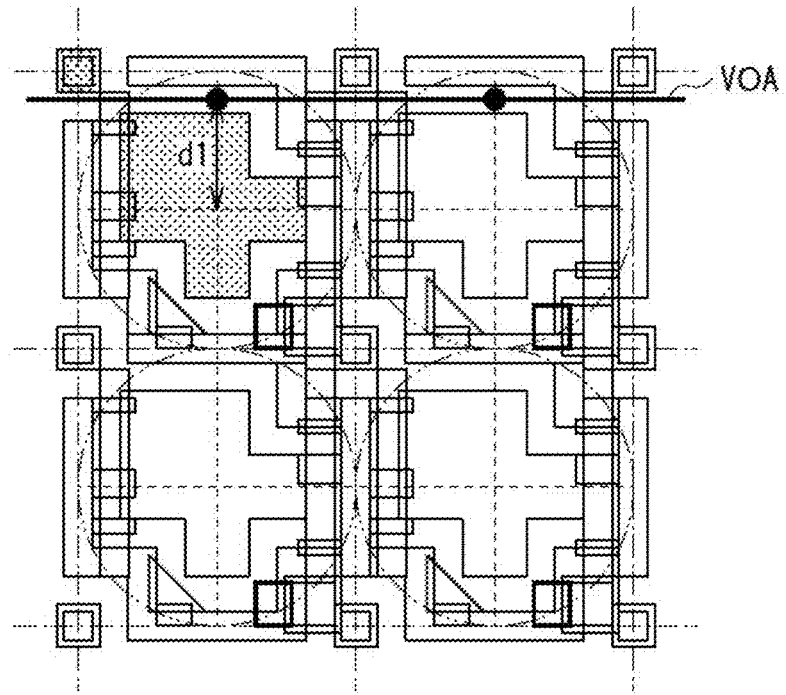
FIG. 27 is a diagram illustrating another example of the wiring lines coupled to the photoelectric converters and the various transistors related thereto according to the modification example of the present disclosure.

FIG. 21 illustrates another example of a layout of the lower electrode 21 included in the organic photoelectric converter 20 of the imaging element 10A according to a modification example of the present disclosure. FIG. 22 illustrates another example of a layout of the inorganic photoelectric converter 32B and various transistors related thereto of the imaging element 10A according to the modification example of the present disclosure. FIG. 23 illustrates another example of a layout of the inorganic photoelectric converter R and various transistors related thereto of the imaging element 10A according to the modification example of the present disclosure. FIGS. 24 to 27 illustrate other examples of wiring lines coupled to the photoelectric converters 20, 32B, and 32R and various transistors related thereto. In the first embodiment, an example is shown of the pixel sharing structure in which four pixels that are adjacent to each other share one floating diffusion FD1, one floating diffusion FD2, and one floating diffusion FD3 each corresponding to each of the four pixels, but the present disclosure is not limited thereto. For example, as illustrated in FIGS. 21 to 27, it is possible to form the imaging element 10A according to the first embodiment as a stacked imaging element having a so-called single pixel structure, which does not have a pixel sharing structure.

6. Application Example

Application Example 1

Figure 28:
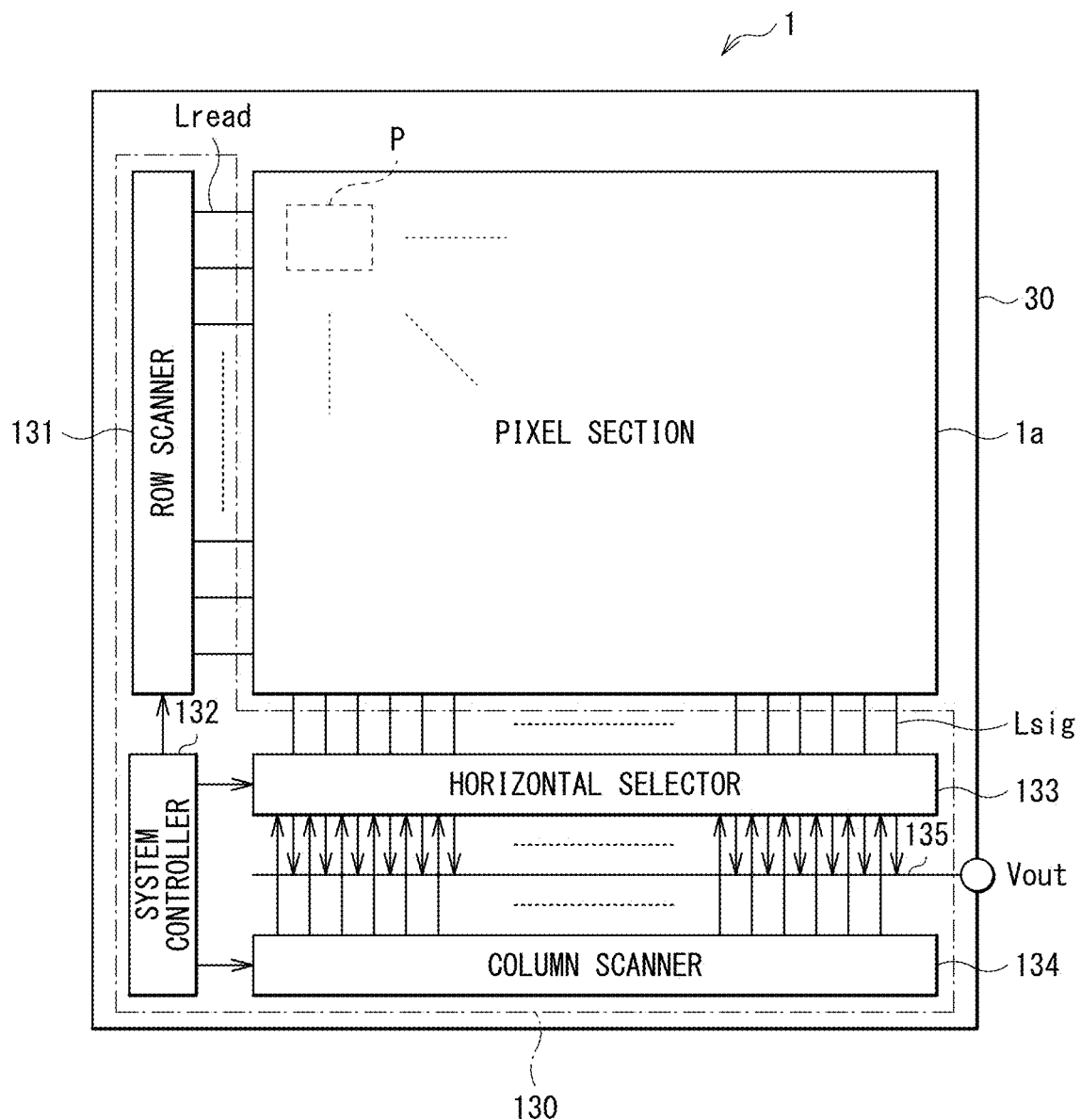
FIG. 28 is a block diagram illustrating a configuration of an imaging device including the imaging element illustrated in FIG. 1 or the like as a pixel.

FIG. 28 illustrates an overall configuration of an imaging device (imaging device 1) that includes, for each of the pixels, the imaging element 10A (or the imaging elements 10B to 10D) described in the above-described first to fourth embodiments (or the modification example). This imaging device 1 is a CMOS image sensor and includes a pixel section 1a as an imaging area and a peripheral circuit section 130 in a peripheral region of this pixel section 1a on the semiconductor substrate 30. The peripheral circuit section 130 includes, for example, a row scanner 131, a horizontal selector 133, a column scanner 134, and a system controller 132.

The pixel section 1a includes, for example, the plurality of unit pixels P (each corresponding to the imaging element 10) that are two-dimensionally disposed in a matrix. In these unit pixels P, pixel drive lines Lread (specifically, row selection lines and reset control lines) are disposed in each of pixel rows, for example, and vertical signal lines Lsig are disposed in each of pixel columns. The pixel drive lines Lread are each for transmitting drive signals for reading out signals from pixels. One end of each of the pixel drive lines Lread is coupled to the output end of the row scanner 131 corresponding to each row.

The row scanner 131 is a pixel driver that includes a shift register, an address decoder, and the like and drives the respective unit pixels P of the pixel section 1a, for example, row by row. Signals outputted from the respective unit pixels P in the pixel rows selectively scanned by the row scanner 131 are supplied to the horizontal selector 133 through the respective vertical signal lines Lsig. The horizontal selector 133 includes an amplifier, a horizontal selection switch, and the like provided for each of the vertical signal lines Lsig.

The column scanner 134 includes a shift register, an address decoder, and the like and drives each of the horizontal selection switches of the horizontal selector 133 in order while scanning the horizontal selection switches. The selective scanning by this column scanner 134 causes the signals of the respective pixels transmitted through the respective vertical signal lines Lsig to be outputted in order to a horizontal signal line 135 and transmitted to the outside of the semiconductor substrate 30 through the horizontal signal line 135.

Circuit portions including the row scanner 131, the horizontal selector 133, the column scanner 134, and the horizontal signal line 135 may be formed directly on the semiconductor substrate 30 or disposed in external control IC. In addition, those circuit portions may be formed on another substrate coupled by a cable or the like.

The system controller 132 receives a clock supplied from the outside of the semiconductor substrate 30, data for an instruction about an operation mode, and the like and outputs data such as internal information of the imaging device 1. The system controller 132 further includes a timing generator that generates various timing signals and controls the driving of the peripheral circuits such as the row scanner 131, the horizontal selector 133, the column scanner 134, and the like on the basis of the various timing signals generated by the timing generator.

Application Example 2

Figure 29:
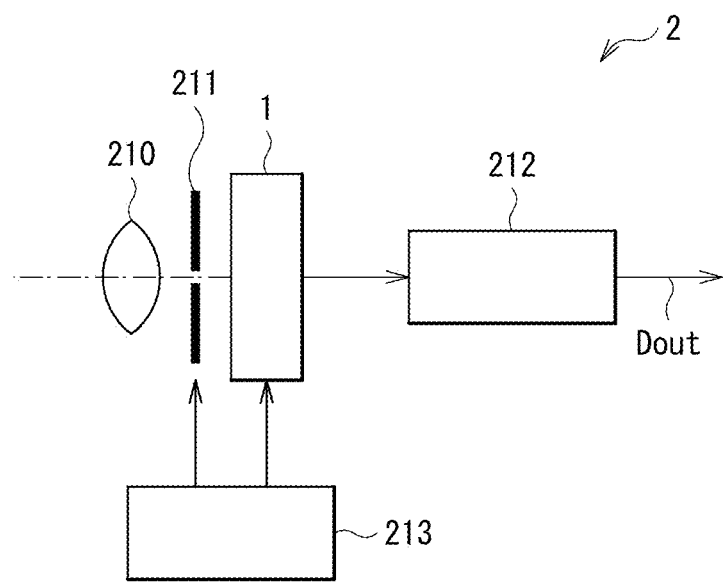
FIG. 29 is a functional block diagram illustrating an example of an electronic apparatus (camera) including the imaging device illustrated in FIG. 18.

The above-described imaging device 1 is applicable, for example, to any type of electronic apparatus having an imaging function including a camera system such as a digital still camera and a video camera, a mobile phone having an imaging function, and the like. FIG. 29 illustrates a schematic configuration of an electronic apparatus 2 (camera) as an example thereof. This electronic apparatus 2 is, for example, a video camera that is able to shoot a still image or a moving image. The electronic apparatus 2 includes the imaging device 1, an optical system (optical lens) 310, a shutter device 311, a driver 313 that drives the imaging device 1 and the shutter device 311, and a signal processor 312.

The optical system 310 guides image light (incident light) from a subject to the pixel section 1a of the imaging device 1. This optical system 310 may include a plurality of optical lenses. The shutter device 311 controls a period in which the imaging device 1 is irradiated with light and a period in which light is blocked. The driver 313 controls a transfer operation of the imaging device 1 and a shutter operation of the shutter device 311. The signal processor 312 performs various kinds of signal processing on a signal outputted from the imaging device 1. An image signal Dout subjected to the signal processing is stored in a storage medium such as a memory or outputted to a monitor or the like.

7. Practical Application Example

Further, the above-described imaging device 1 is also applicable to the following electronic apparatuses (a capsule type endoscope 10100 and a mobile body such as a vehicle).

Example of Practical Application to In-Vivo Information Acquisition System

Further, the technology (the present technology) according to the present disclosure is applicable to a variety of products. For example, the technology according to the present disclosure may be applied to an endoscopic surgery system.

Figure 30:
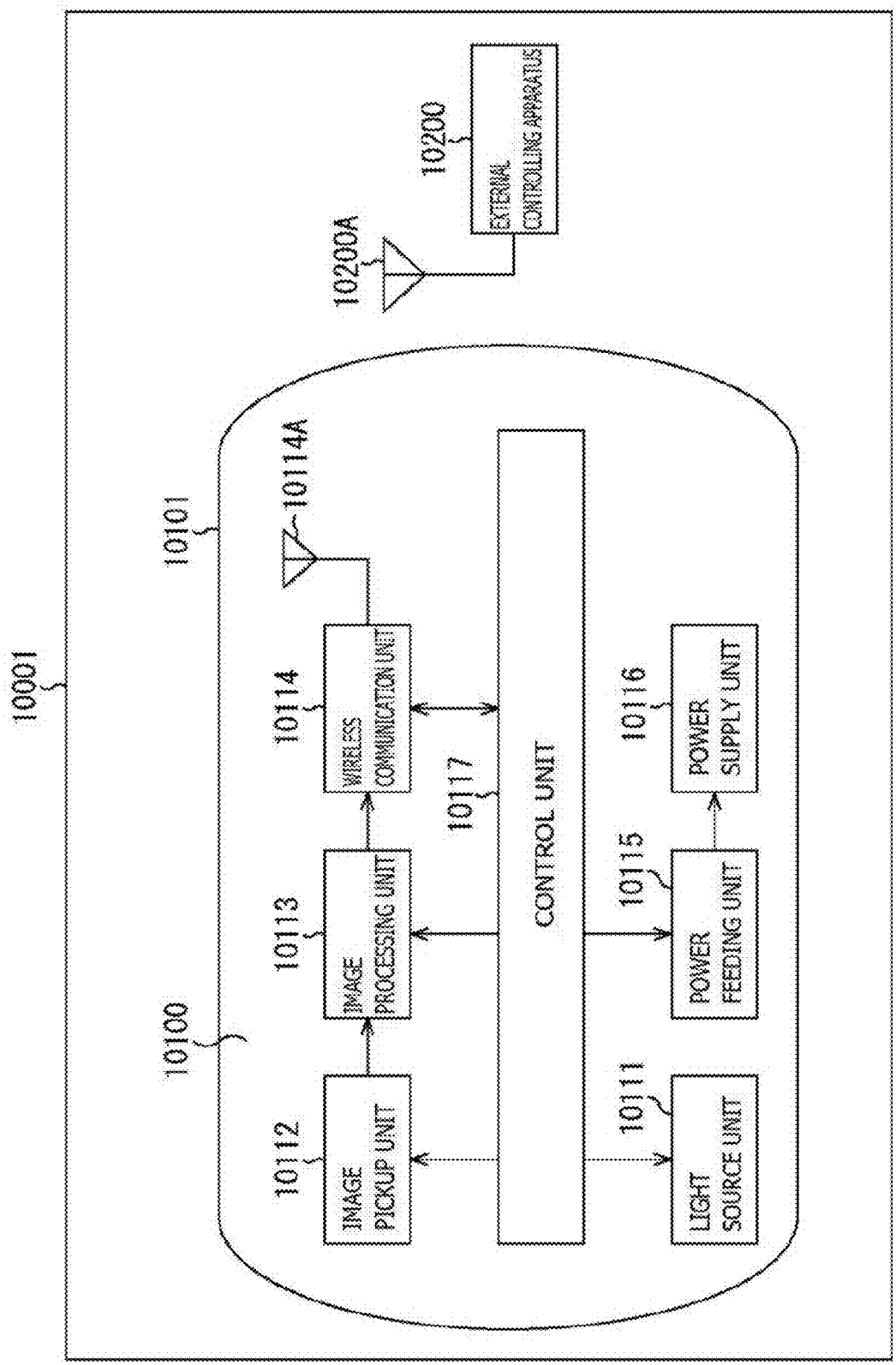
FIG. 30 is a block diagram depicting an example of a schematic configuration of an in-vivo information acquisition system.

FIG. 30 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 30, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The above has described the example of the in-vivo information acquisition system to which the technology according to the present disclosure may be applied. The technology according to the present disclosure may be applied, for example, to the image pickup unit 10112 among the above-described components. This increases the detection accuracy.

Example of Practical Application to Endoscopic Surgery System

The technology (the present technology) according to the present disclosure is applicable to a variety of products. For example, the technology according to the present disclosure may be applied to an endoscopic surgery system.

Figure 31:
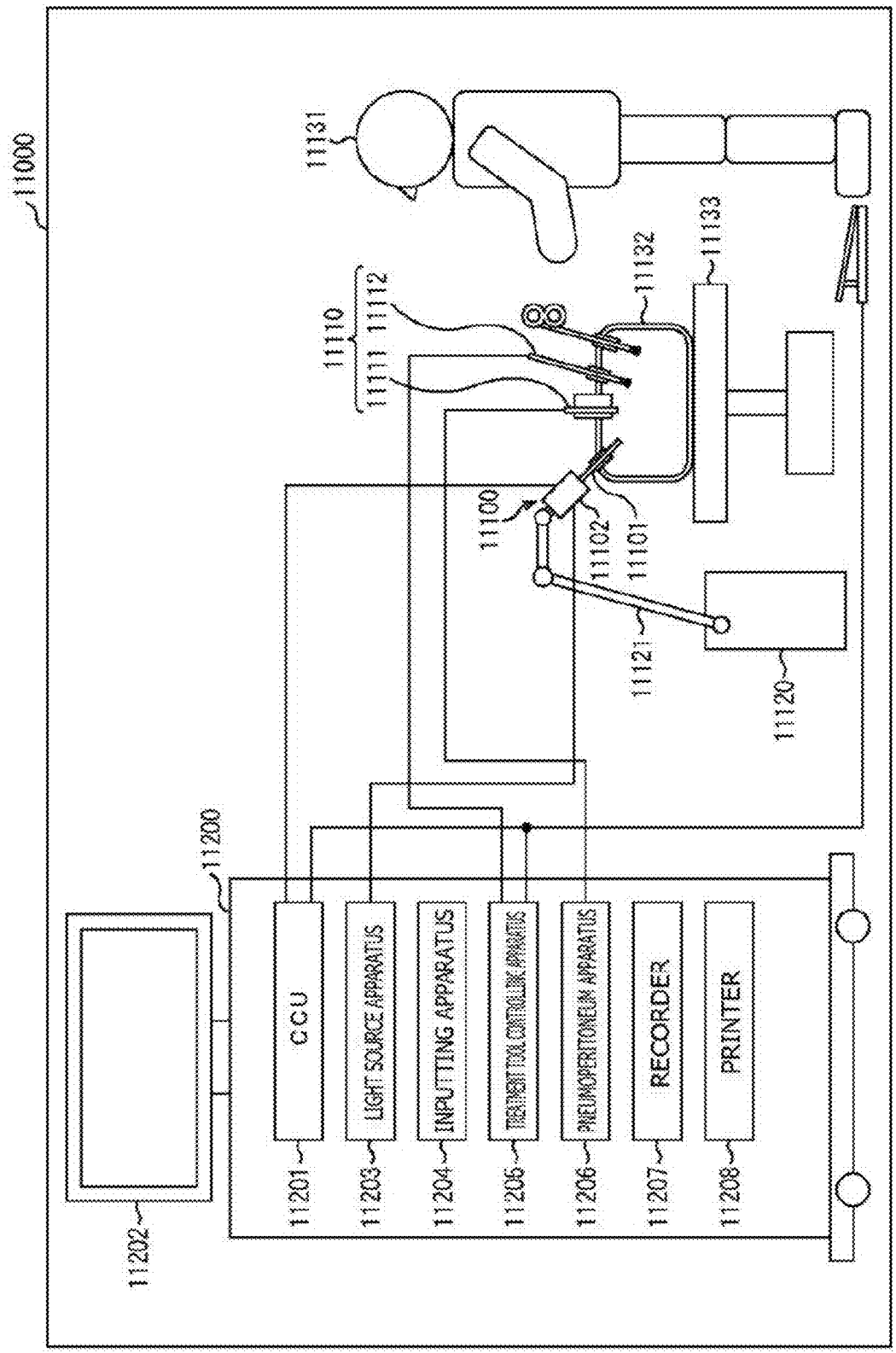
FIG. 31 is a view depicting an example of a schematic configuration of an endoscopic surgery system.

FIG. 31 is a view depicting an example of a schematic configuration of an endoscopic surgery system to which the technology according to an embodiment of the present disclosure (present technology) can be applied.

In FIG. 31, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 32:
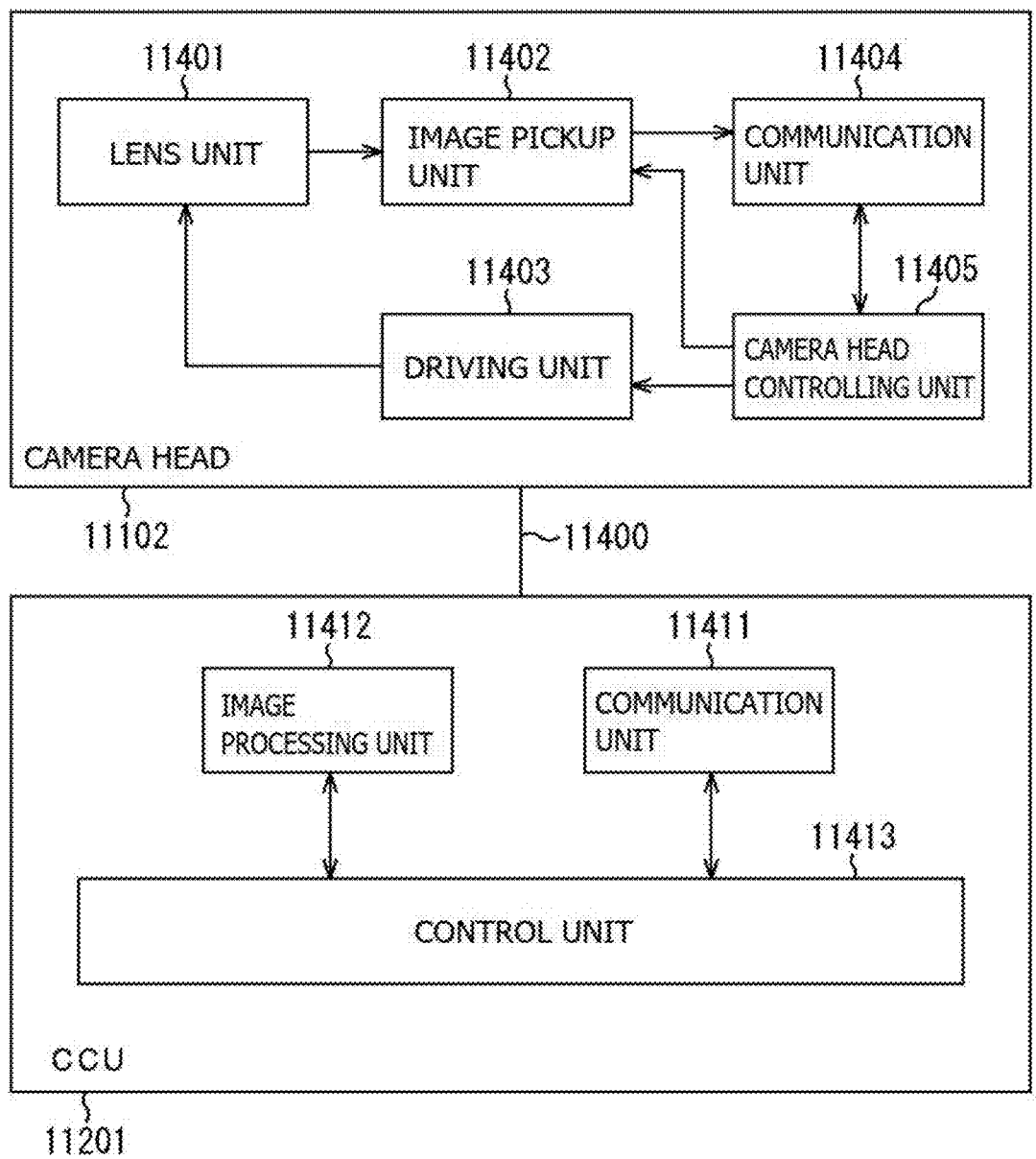
FIG. 32 is a block diagram depicting an example of a functional configuration of a camera head and a camera control unit (CCU).

FIG. 32 is a block diagram depicting an example of a functional configuration of the camera head 11102 and the CCU 11201 depicted in FIG. 31.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure may be applied. The technology according to the present disclosure may be applied to the image pickup unit 11402 among the above-described components. Applying the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

Example of Practical Application to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 33:
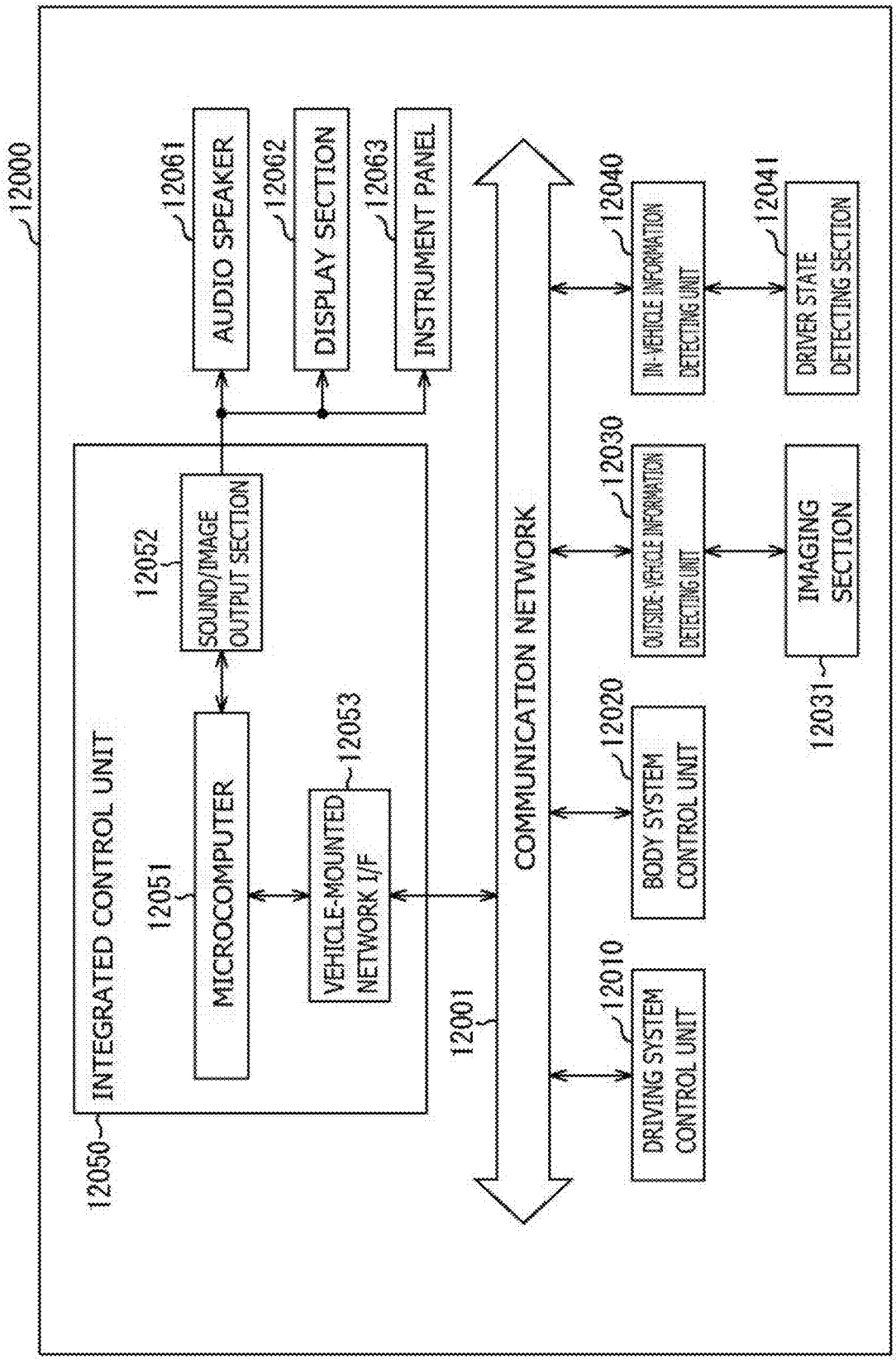
FIG. 33 is a block diagram depicting an example of schematic configuration of a vehicle control system.

FIG. 33 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 33, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 33, an audio speaker 12061, a display section 12062, and an instrument panel 12063 are illustrated as the output device. The display section 12062 may, for example, include at least one of an on-board display and a head-up display.

Figure 34:
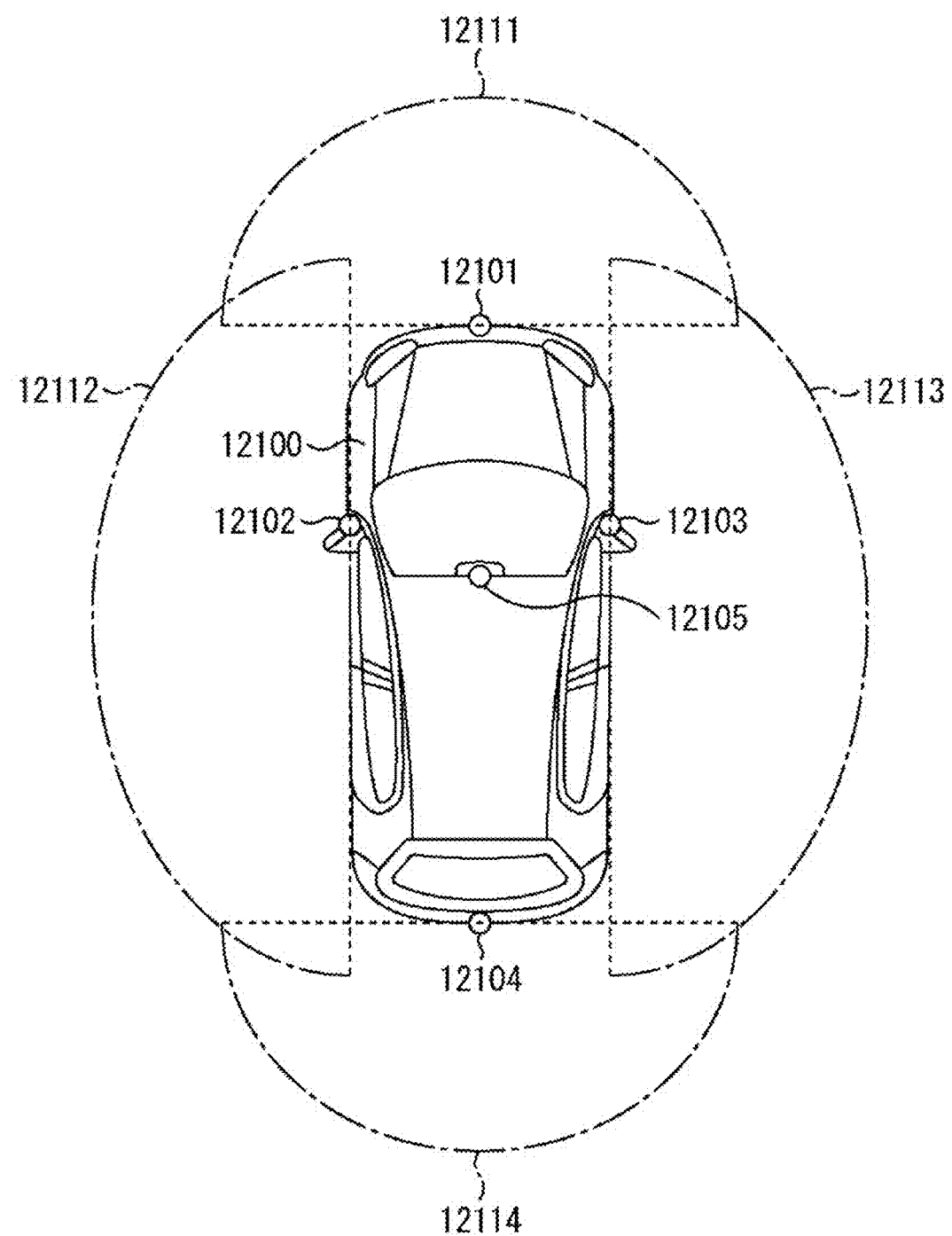
FIG. 34 is a diagram of assistance in explaining an example of installation positions of an outside-vehicle information detecting section and an imaging section.

FIG. 34 is a diagram depicting an example of the installation position of the imaging section 12031.

In FIG. 34, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 34 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although the description has been given with reference to the first to fourth embodiments, the modification example, and the application examples, the contents of the present disclosure are not limited to the above-described embodiments and the like. The present disclosure may be modified in a variety of ways. For example, in the above-described embodiments, an imaging element has a configuration in which the organic photoelectric converter 20 that detects green light and the inorganic photoelectric converters 32B and 32R that respectively detect blue light and red light are stacked. However, the contents of the present disclosure are not limited to such a structure. That is, the organic photoelectric converter may detect the red light or the blue light or the inorganic photoelectric converters may each detect the green light.

In addition, the number of these organic photoelectric converters and inorganic photoelectric converters or the proportion therebetween are not limited. Color signals of a plurality of colors may be obtained with the organic photoelectric converter alone.

Further, in the above-described embodiments and the like, the examples have been demonstrated in which a plurality of electrodes included in the lower electrode 21 includes the two electrodes of the readout electrode 21A and the accumulation electrode 21B. There may be, however, provided additionally three or four or more electrodes including a transfer electrode, a discharge electrode, or the like.

Still further, in the first embodiment, although an example is shown in which the charge accumulation layer 23, the photoelectric conversion layer 24, and the upper electrode 25 are formed as continuous layers common to the plurality of plurality of imaging elements 10A, they may be formed separately for each pixel P. However, in such a case, dark current characteristics may deteriorate due to an influence of process damage on the charge accumulation layer 23 and the photoelectric conversion layer 24. In addition, as in the above first embodiment, in the case where the continuous layers common to the plurality of imaging elements 10A are formed so as to extend in the effective pixel region 110A, the pixels are coupled to each other by the photoelectric conversion layer; therefore, color mixture may occur due to mixing of charges between pixels. This is suppressed by providing the shield electrode 21C as described above.

It is to be noted that the effects described herein are merely examples, but not limitative. In addition, there may be other effects.

It is to be noted that the present disclosure may have the following configurations. According to the present technology having the following configuration, a first hydrogen-blocking layer is provided above a charge accumulation layer and an organic photoelectric conversion layer extending in an effective pixel region and covering side surfaces thereof; therefore entry of hydrogen into the charge accumulation layer is suppressed. This makes it possible to improve reliability of an imaging element including the organic photoelectric converter and an imaging device including the imaging element.

(1)
An imaging element including:
a semiconductor substrate having an effective pixel region in which a plurality of pixels is disposed and a peripheral region provided around the effective pixel region;
an organic photoelectric converter including a first electrode, a second electrode, a charge accumulation layer, and an organic photoelectric conversion layer, the first electrode being provided on a light receiving surface of the semiconductor substrate and including a plurality of electrodes, the second electrode being opposed to the first electrode, the charge accumulation layer and the organic photoelectric conversion layer being stacked in this order between the first electrode and the second electrode and extending over the effective pixel region; and
a first hydrogen-blocking layer that covers above the organic photoelectric conversion layer, a side surface of the organic photoelectric conversion layer, and a side surface of the charge accumulation layer.

(2)
The imaging element according to (1), further including a second hydrogen-blocking layer below the charge accumulation layer.

(3)
The imaging element according to (2), in which the second hydrogen-blocking layer is
provided between the semiconductor substrate and the charge accumulation layer.

(4)
The imaging element according to (2) or (3), in which
the organic photoelectric converter further includes an insulating layer between the first electrode and the charge accumulation layer, and
the insulating layer is formed as the second hydrogen-blocking layer.

(5)
The imaging element according to (4), in which the second hydrogen-blocking layer is in contact with the first hydrogen-blocking layer in the peripheral region.

(6)

The imaging element according to any one of (2) to (5), in which the first hydrogen-blocking layer and the second hydrogen-blocking layer are each formed by using an insulating material.

(7)

The imaging element according to any one of (2) to (6), in which the first hydrogen-blocking layer and the second hydrogen-blocking layer are each formed by including a metal oxide having light transmissivity.

(8)

The imaging element according to any one of (2) to (7), in which the first hydrogen-blocking layer and the second hydrogen-blocking layer each include a single layer or a plurality of layers.

(9)

The imaging element according to any one of (2) to (8), in which the first hydrogen-blocking layer and the second hydrogen-blocking layer are each an aluminum oxide ($AlO_x$) film, a silicon nitride ($SiN_x$) film, or a carbon-containing silicon oxide film (SiOC) film.

(10)

The imaging element according to any one of (1) to (9), further including:
 a first protective layer; and
 a second protective layer, in which
 the first hydrogen-blocking layer, the first protective layer, and the second protective layer are stacked in this order.

(11)

The imaging element according to (10), in which the first protective layer and the second protective layer are each formed by using an insulating material.

(12)

The imaging element according to (10) or (11), in which the first protective layer and the second protective layer are each formed by including a metal oxide having light transmissivity.

(13)

The imaging element according to any one of (10) to (12), in which the first protective layer and the second protective layer each include a single layer or a plurality of layers.

(14)

The imaging element according to any one of (10) to (13), in which the first protective layer and the second protective layer are each a single-layer film including one of an aluminum oxide ($AlO_x$) film, a silicon nitride ($SiN_x$) film, a carbon-containing silicon oxide (SiOC) film, a silicon oxide ($SiO_x$) film, and a silicon oxynitride ($SiO_xN_y$) film, or a stacked film including two or more thereof.

(15)

The imaging element according to any one of (10) to (14), further including:
 a pad section; and
 a wiring line that couples the second electrode to the pad section, in which
 the second protective layer is provided at least over a coupling section between the second electrode and the wiring line and over a coupling section between the pad section and the wiring line.

(16)

The imaging element according to any one of (1) to (15), in which the organic photoelectric converter further includes an insulating layer between the first electrode and the charge accumulation layer, and the insulating layer includes an opening on one electrode out of the plurality of electrodes included in the first electrode, and the one electrode and the charge accumulation layer are electrically coupled to each other via the opening.

(17)

The imaging element according to any one of (1) to (16), in which the semiconductor substrate has an inorganic photoelectric converter embedded therein.

(18)

An imaging device including
 an imaging element, the imaging element including:
  a semiconductor substrate having an effective pixel region in which a plurality of pixels is disposed and a peripheral region provided around the effective pixel region;
  an organic photoelectric converter including a first electrode, a second electrode, a charge accumulation layer, and an organic photoelectric conversion layer, the first electrode being provided on a light receiving surface of the semiconductor substrate and including a plurality of electrodes, the second electrode being opposed to the first electrode, the charge accumulation layer and the organic photoelectric conversion layer being stacked in this order between the first electrode and the second electrode and extending over the effective pixel region; and
  a first hydrogen-blocking layer that covers above the organic photoelectric conversion layer, a side surface of the organic photoelectric conversion layer, and a side surface of the charge accumulation layer.

This application claims the benefit of Japanese Priority Patent Application JP2018-143511 filed with the Japan Patent Office on Jul. 31, 2018 and Japanese Priority Patent Application JP2018-234673 filed with the Japan Patent Office on Dec. 14, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. An imaging element, comprising:
 a semiconductor substrate having an effective pixel region in which a plurality of pixels is disposed and a peripheral region provided around the effective pixel region;
 an organic photoelectric converter including a first electrode, a second electrode, a charge accumulation layer, and an organic photoelectric conversion layer, the first electrode being provided on a light receiving surface of the semiconductor substrate and including a plurality of electrodes, the second electrode being opposed to the first electrode, the charge accumulation layer and the organic photoelectric conversion layer being stacked in this order between the first electrode and the second electrode and extending over the effective pixel region; and
 a first hydrogen-blocking layer including a top first hydrogen-blocking layer and a bottom first hydrogen-blocking layer that covers above the organic photoelectric conversion layer,
 wherein the top first hydrogen-blocking layer covers a side surface of the organic photoelectric conversion layer, and a side surface of the charge accumulation layer, and
 wherein the top first hydrogen-blocking layer has a thickness greater than a thickness of the bottom first hydrogen-blocking layer.

2. The imaging element according to claim 1, further comprising a second hydrogen-blocking layer below the charge accumulation layer.

3. The imaging element according to claim 2, wherein the second hydrogen-blocking layer is provided between the semiconductor substrate and the charge accumulation layer.

4. The imaging element according to claim 2, wherein
the organic photoelectric converter further includes an insulating layer between the first electrode and the charge accumulation layer, and
the insulating layer is formed as the second hydrogen-blocking layer.

5. The imaging element according to claim 4, wherein the second hydrogen-blocking layer is in contact with the first hydrogen-blocking layer in the peripheral region.

6. The imaging element according to claim 2, wherein the first hydrogen-blocking layer and the second hydrogen-blocking layer are each formed by using an insulating material.

7. The imaging element according to claim 2, wherein the first hydrogen-blocking layer and the second hydrogen-blocking layer are each formed by including a metal oxide having light transmissivity.

8. The imaging element according to claim 2, wherein the first hydrogen-blocking layer and the second hydrogen-blocking layer each include a single layer or a plurality of layers.

9. The imaging element according to claim 2, wherein the first hydrogen-blocking layer and the second hydrogen-blocking layer are each an aluminum oxide ($AlO_x$) film or a carbon-containing silicon oxide film (SiOC) film.

10. The imaging element according to claim 1, further comprising:
a first protective layer; and
a second protective layer,
wherein the first hydrogen-blocking layer, the first protective layer, and the second protective layer are stacked in this order.

11. The imaging element according to claim 10, wherein the first protective layer and the second protective layer are each formed by using an insulating material.

12. The imaging element according to claim 10, wherein the first protective layer and the second protective layer are each formed by including a metal oxide having light transmissivity.

13. The imaging element according to claim 10, wherein the first protective layer and the second protective layer each include a single layer or a plurality of layers.

14. The imaging element according to claim 10, wherein the first protective layer and the second protective layer are each a single-layer film including one of an aluminum oxide ($AlO_x$) film, a silicon nitride ($SiN_x$) film, a carbon-containing silicon oxide (SiOC) film, a silicon oxide ($SiO_x$) film, and a silicon oxynitride ($SiO_xN_y$) film, or a stacked film including two or more thereof.

15. The imaging element according to claim 10, further comprising:
a pad section; and
a wiring line that couples the second electrode to the pad section,
wherein the second protective layer is provided at least over a coupling section between the second electrode and the wiring line and over a coupling section between the pad section and the wiring line.

16. The imaging element according to claim 1, wherein
the organic photoelectric converter further includes an insulating layer between the first electrode and the charge accumulation layer, and
the insulating layer includes an opening on one electrode out of the plurality of electrodes included in the first electrode, and the one electrode and the charge accumulation layer are electrically coupled to each other via the opening.

17. The imaging element according to claim 1, wherein the semiconductor substrate has an inorganic photoelectric converter embedded therein.

18. An imaging device, comprising:
an imaging element, the imaging element including:
a semiconductor substrate having an effective pixel region in which a plurality of pixels is disposed and a peripheral region provided around the effective pixel region;
an organic photoelectric converter including a first electrode, a second electrode, a charge accumulation layer, and an organic photoelectric conversion layer, the first electrode being provided on a light receiving surface of the semiconductor substrate and including a plurality of electrodes, the second electrode being opposed to the first electrode, the charge accumulation layer and the organic photoelectric conversion layer being stacked in this order between the first electrode and the second electrode and extending over the effective pixel region; and
a first hydrogen-blocking layer including a top first hydrogen-blocking layer and a bottom first hydrogen-blocking layer that covers above the organic photoelectric conversion layer,
wherein the top first hydrogen-blocking layer covers a side surface of the organic photoelectric conversion layer, and a side surface of the charge accumulation layer, and
wherein the top first hydrogen-blocking layer has a thickness greater than a thickness of the bottom first hydrogen-blocking layer.

19. The imaging device according to claim 18, further comprising a second hydrogen-blocking layer below the charge accumulation layer.

20. The imaging device according to claim 19, wherein the first hydrogen-blocking layer and the second hydrogen-blocking layer are each an aluminum oxide ($AlO_x$) film or a carbon-containing silicon oxide film (SiOC) film.

* * * * *